United States Patent
Furuhashi et al.

[11] Patent Number: 5,942,835
[45] Date of Patent: Aug. 24, 1999

[54] PIEZOELECTRIC TRANSFORMER DRIVE CIRCUIT

[75] Inventors: Naoki Furuhashi; Hirokazu Takayoshi, both of Tokyo, Japan

[73] Assignee: NEC Corporation, Tokyo, Japan

[21] Appl. No.: 08/956,454

[22] Filed: Oct. 23, 1997

[30] Foreign Application Priority Data

Oct. 24, 1996 [JP] Japan .................................. 8-282316

[51] Int. Cl.$^6$ ............................ H01L 41/08; H02M 3/00
[52] U.S. Cl. ....................................................... 310/316.01
[58] Field of Search ................................. 310/316, 317, 310/359

[56] References Cited

U.S. PATENT DOCUMENTS

| | | | |
|---|---|---|---|
| 5,675,484 | 10/1997 | Shimadaq | 363/71 |
| 5,705,877 | 1/1998 | Shimada | 310/318 |
| 5,731,652 | 3/1998 | Shimada | 310/316 |
| 5,739,622 | 4/1998 | Zaitsu | 310/316 |
| 5,760,619 | 6/1998 | Yamaguchi | 327/110 |
| 5,796,213 | 8/1998 | Kawasaki | 315/209 R |

FOREIGN PATENT DOCUMENTS

| | | | |
|---|---|---|---|
| 8-107678 | 4/1996 | Japan | H02M 7/48 |
| 9/107684 | 4/1997 | Japan | H02M 7/538 |

*Primary Examiner*—Thomas M. Dougherty
*Attorney, Agent, or Firm*—Sughrue, Mion, Zinn, Macpeak & Seas, PLLC

[57] ABSTRACT

In a piezoelectric transformer drive circuit, a first autotransformer and a second autotransformer input to their primary terminals from a drive voltage control circuit and impress an ac voltage to each primary electrode of the piezoelectric transformer that is connected to each secondary terminal of the autotransformers; and the piezoelectric transformer supplies voltage generated from the secondary electrodes to a load. A frequency divider circuit alternately drives the first and second switching transistors connected to intermediate terminals of the first and second autotransformers. An output voltage comparison circuit compares the output voltage of the piezoelectric transformer with a prescribed maximum value, and if an overvoltage is detected in the output, the output voltage comparison circuit both outputs a reset signal to frequency control circuit and outputs a control signal to a dimmer circuit that changes duty ratio. The dimmer circuit generates a drive halt signal to drive voltage control circuit, performs duty ratio control, and outputs a control signal to the frequency control circuit such that the frequency of a VCO of the frequency control circuit does not change during drive halts. The frequency control circuit outputs a triangular wave signal to the frequency divider circuit, and the drive voltage control circuit inputs the power source voltage and controls the peak voltage driving the piezoelectric transformer to a fixed level. Furthermore, coils may be used in place of autotransformers.

16 Claims, 24 Drawing Sheets

PIEZOELECTRIC TRANSFORMER DRIVE CIRCUIT

BACKGROUND OF THE INVENTION

1. Field of the Invention

The present invention relates to the drive circuit for a piezoelectric transformer that generates an ac voltage using a piezoelectric transformer element, and particularly relates to a drive method during a state in which load is open or in which a cold cathode tube used as load has high impedance and does not turn on.

2. Description of the Related Art

A piezoelectric transformer is generally an element in which primary and secondary electrodes are affixed to a piezoelectric material, the transformer is caused to mechanically resonate by impressing voltage of the transformer resonance frequency on the primary side, and the voltage generated due to this mechanical resonance is extracted from the secondary side. Such an element features greater capabilities for production in smaller and thinner sizes than an electromagnetic transformer and is therefore receiving attention for such applications as the backlight power source in liquid crystal displays.

Japanese Patent Application 264081/95 discloses one example of this type of piezoelectric element drive circuit. As shown in FIG. 1, this circuit is made up of: piezoelectric transformer 1 that inputs an ac voltage from primary electrodes and outputs from secondary electrodes using the piezoelectric effect; first auto transformer 5 that has its secondary terminal connected to one of the primary electrodes of piezoelectric transformer 1 and its primary terminal connected to the power source; first switching transistor 7 that has its output terminal connected to an intermediate terminal of first autotransformer 5; second autotransformer 6 that has its secondary terminal connected to the other of the primary electrodes of piezoelectric transformer 1 and its primary terminal connected to the power source; second switching transistor 8 that has its output terminal connected to an intermediate terminal of second autotransformer 6; frequency divider circuit 9 that alternately drives first switching transistor 7 and second switching transistor 8; frequency control circuit 3 that outputs a drive signal and a triangular wave signal to frequency divider circuit 9 and drive voltage control circuit 11, respectively; drive voltage control circuit 11 that controls the peak voltage that drives the piezoelectric transformer to a fixed level; dimmer circuit 12 that generates a drive halt signal to drive voltage control circuit 11 and performs drive ON/OFF duty control and in addition, outputs a control signal to frequency control circuit 3 such that the frequency of VCO 18 (FIG. 12) does not vary between drive halts.

This construction enables a fixed voltage and current to be outputted to a load despite fluctuation in power source voltage VDD, and in addition, enables prevention of drops in conversion efficiency because the frequency driving the piezoelectric transformer does not vary.

Next, regarding the operation of this circuit, first switching transistor 7 and second switching transistor 8 alternately turn ON in response to clocks of opposite phases outputted from frequency divider circuit 9, current flows from power source VDD to the primary sides of first autotransformer 5 and second autotransformer 6, and this current energy is charged on the autotransformer windings as current energy. When first switching transistor 7 and second switching transistor 8 turn OFF, the charged energy is discharged and a voltage higher than the power source voltage is generated as voltage energy.

FIG. 18 shows the piezoelectric transformer input voltage waveforms Vs1 and Vs2 and the switching transistor drain voltage waveforms Vd1 and Vd2. These waveforms are voltage-resonated waveforms due to the equivalent input capacitance of piezoelectric transformer 1 and load 2 and the sum inductance of the primary inductance and secondary inductance of an electromagnetic transformer, and are set so as to become the half-wave of the sine wave that reaches zero voltage in the time interval of one-half the resonance period of piezoelectric transformer 1.

The use of autotransformers has the advantage of allowing a higher boost ratio than a two-winding electromagnetic transformer of the same turn ratio, and moreover, because the same boost ratio can be obtained with a lower turn ratio, has the advantage of making an electromagnetic transformer smaller and thinner.

The generated voltage is alternately inputted to the primary electrodes of piezoelectric transformer 1; therefore a drive voltage of the waveform equivalent to a sine wave oscillates piezoelectric transformer 1, and an output voltage of the boost ratio times, which is determined by the form of piezoelectric transformer 1, is outputted from the secondary electrodes. This voltage $V_O$ is impressed to load 2, and current $I_O$ that flows through load 2 and is fed back is inputted to frequency control circuit 3. Frequency control circuit 3 generates the frequency that drives piezoelectric transformer 1 via frequency divider circuit 9, continues sweeping the drive frequency until the feedback current $I_O$ from the load reaches a prescribed value, and holds the frequency at a frequency at which the prescribed value is obtained.

As shown in FIG. 14, frequency control circuit 3 is made up of voltage-current conversion circuit 13, rectifying circuit 14, comparator 15, integrator 16, comparator 17, and VCO 18. Current $I_O$ which is fed back from load 2 is converted at current-voltage conversion circuit 13, converted to dc voltage at rectifying circuit 14, and inputted to comparator 15. At comparator 15, the inputted voltage is compared with reference voltage Vref and a high-level signal is outputted to integrator 16 if the inputted voltage is lower. Integrator 16 is constructed so as to boost the input voltage by a fixed ratio during the interval of input of high-level voltage, and this output voltage is inputted to VCO 18. VCO 18 is a voltage-controlled oscillator that outputs a triangular wave voltage at a frequency in inverse proportion to the inputted voltage. The oscillation frequency of VCO 18 is frequency-divided at frequency divider circuit 9, and piezoelectric transformer 1 is driven at this frequency. Accordingly, the drive frequency continues to drop if a voltage lower than the reference voltage Vref is inputted to comparator 15.

The drive frequency of piezoelectric transformer 1 is set so as to fall from f1 shown in FIG. 13, and accordingly, approaches the resonance frequency fr having the highest boost ratio of piezoelectric transformer 1. The boost ratio of piezoelectric transformer 1 therefore increases and the output current of piezoelectric transformer 1 increases over time. When the voltage inputted to comparator 15 becomes greater than the reference voltage Vref at drive frequency f0, the output voltage of comparator 15 becomes low level. With this signal, the output signal of integrator 16 is held unchanged at the voltage immediately preceding the change to low level, the output frequency of VCO 18 is held uniform, and piezoelectric transformer 1 is driven at a fixed frequency.

In a case in which load 2 is a cold cathode tube and the tube current is not sufficient to turn on the cold cathode tube despite the activation of power source VDD or when the voltage inputted to booster circuit 4 is low, a state exists in which feedback current $I_0$ is not generated such that the input voltage to comparator 15 is greater than the reference voltage Vref. Under these conditions, the output of comparator 15 remains unchanged at high level and the drive frequency continues to drop. Upon reaching frequency f2 shown in FIG. 13, comparator 17, which inputs the output of integrator 16, exceeds its reference voltage Vmin and outputs a high-level signal to reset integrator 16. Integrator 16 is thereby reset, the output voltage becomes the minimum voltage, and the output of VCO 18 enters a state in which frequency divider circuit 9 outputs frequency f1. The drive frequency drops from f1, and the above-described operation is repeated.

As shown in FIG. 16, drive voltage control circuit 11 is a circuit in which the drain voltage waveform Vd1 of first switching transistor 7 is voltage-divided and rectified at voltage divider/rectifier circuit 20, inputted to the non-inverted input terminal of comparator 19, the triangular wave Vr of the drive frequency generated at VCO 18 is inputted to the inverted input terminal, and the comparison result is inverted and inputted to the gate of a p-channel power MOSFET (hereinbelow referred to as "Q3") by way of an OR circuit. FIG. 19 is a timing chart showing the operation of: voltage Vc, which is the result of voltage-dividing and rectifying drain voltage waveform Vd1; triangular wave Vr of the drive frequency generated by frequency control circuit 3; Q3 gate voltage Vg3; output voltages Vg1 and Vg2 of the frequency divider circuit; first switching transistor drain voltage waveform Vd1; and second switching transistor drain voltage waveform Vd2. When the drain voltage is high, the non-inverted input terminal voltage Vc becomes large, and the higher the voltage Vc inputted to comparator 19, the greater the proportion of time during which Q3 gate voltage Vg3 is outputted. The time interval during which the source and drain of Q3 is open thus increases and the input power to booster circuit 4 decreases, and control is therefore executed to lower the switching transistor drain voltages Vd1 and Vd2. When the drain voltages are low, non-inverted input terminal voltage Vc becomes low, and the lower the voltage Vc inputted to comparator 19, the smaller the proportion of time during which Q3 gate voltage Vg3 is outputted. Thus, the time interval during which the source-drain of Q3 is open becomes shorter, the input power to booster circuit 4 increases, and control is executed to raise the switching transistor drain voltages Vd1 and Vd2. Switching transistor drain voltages Vd1 and Vd2 are therefore controlled to fixed voltage values by this continuous control, and a means of maintaining a constant voltage for driving a piezoelectric transformer is realized.

As shown in FIG. 22, dimmer circuit 12 is made up of a triangular wave oscillation circuit 27 that oscillates a dimmer frequency, dc voltage generation circuit 33, and comparator 29. The dc voltage $V_b$ generated at dc voltage generation circuit 33 and the output waveform of triangular wave oscillation circuit 27 are compared at comparator 29, and a variable duty pulse signal is outputted. This signal is connected to frequency control circuit 3 and drive voltage control circuit 11, and serves to turn OFF Q3 during the interval of high level and halt the drive of piezoelectric transformer 1, as well as to hold the output voltage of integrator 16 such that the frequency of VCO 18 does not vary.

When the output voltage of piezoelectric transformer 1 is excessive, the piezoelectric transformer 1 itself breaks down. Japanese Patent Laid-open No. 107678/96 discloses a drive circuit for preventing such breakdown. According to this invention, as shown in FIG. 2, output voltage comparison circuit 10 is connected to the secondary electrodes of piezoelectric transformer 1, and output voltage comparison circuit 10 confers the results of judgment to frequency sweep oscillator 22. Output voltage comparison circuit 10 voltage-divides and rectifies the voltage outputted to the secondary electrodes of piezoelectric transformer 1, has the function of judging whether or not the voltage outputted to the secondary electrodes of piezoelectric transformer 1 exceeds a preset output voltage by comparing the voltage-divided and rectified voltage with an internal reference voltage, and confers this judgment to frequency sweep oscillator 22. Frequency sweep oscillator 22 has the function of switching the frequency sweep and reverses the direction of frequency sweep from the direction of decreasing frequency to the direction of increasing frequency when it is determined that the judgment result of output voltage comparison circuit 10 exceeds the preset output voltage. By means of this function, the drive frequency of piezoelectric transformer 1 is shifted to a low boost ratio state and the output voltage is reduced when the load for whatever reason becomes open, thereby preventing breakdown of the piezoelectric transformer itself brought about by the state of excess oscillation due to the sudden rise in output voltage of a piezoelectric transformer that accompanies an abrupt increase in load impedance.

Nevertheless, the prior art according to Japanese Patent Application No. 264081/95 and Japanese Patent Laid-open No. 107678/96 has the following drawbacks. First, in a state resulting from, for example, low ambient temperature in which the impedance of the cold cathode tube is high and the tube does not turn on, or during a load-open state due to, for example, disconnection, the peak value of the primary current of an electromagnetic transformer may increase at the time of reversal of the frequency divider circuit, thereby giving rise to heating of first autotransformer 5, first switching transistor 7, second autotransformer 6, and second switching transistor 8.

This heating is caused by the increase of the peak value of the current flowing at the time of reversal of the frequency divider circuit to the level of the drive frequency, and under the above-described conditions, the drive frequency sweep will continue endlessly or for an extended period of time.

If the cold cathode tube has high impedance and does not turn on due to, for example, low ambient temperature, or during a load-open state due to, for example, disconnection, and a feedback current $I_0$ is not generated such that the input voltage of comparator 15 exceeds the reference voltage Vref, the output of comparator 15 remains unchanged at high level and the drive frequency drops. The output impedance of piezoelectric transformer 1 is high and the magnitude of its output voltage depends on load impedance, and as a result, because load impedance is high in the above-described states, the output voltage of piezoelectric transformer 1 is also high. Output voltage comparison circuit 10 outputs at frequency f3 shown in FIG. 13. Integrator 16 is reset, the output voltage becomes the minimum voltage, and the output of VCO 18 enters a state such that frequency divider circuit 9 outputs frequency f1. The drive frequency drops from f1, and the above-described series of operations is repeated either endlessly or for an extended period of time.

The instant that a drive frequency f1 is outputted, switching transistor drain voltage waveform Vd1 takes on the waveform shown in FIG. 26, and Vd2 also takes on the same voltage waveform.

At frequency f0 shown in FIG. 13, Vd1 and Vd2 voltage-resonate in accordance with the equivalent input capacitance of piezoelectric transformer 1 and load 2 and the sum inductance of the primary inductance and secondary inductance of an electromagnetic transformer, and these voltage waveforms Vd1 and Vd2 are set to become the half-wave of a sine wave that reaches zero voltage in the time interval of one-half the resonance period of piezoelectric transformer 1. As a result, the time of one cycle decreases to the extent that the drive frequency increases over the resonance frequency f0 as shown in FIG. 26, and the voltage immediately preceding the switch to zero rises. An excessive current therefore flows at the instant of switching to zero, and accordingly, the higher the drive frequency, the greater the increase of the peak value of the current flowing to first autotransformer 5, first switching transistor 7, second autotransformer 6, and second switching transistor 8 at the instant of inversion of frequency divider circuit 9. In a case in which the sweep of the drive frequency is repeated endlessly or for an extended period of time, the drive frequency repeatedly passes the vicinity of frequency f1, which is far higher than f0, and the circuit components generate heat.

The second drawback of the prior art is the difficulty of design for shifting to a low frequency the setting of drive frequency f1 at which integrator 16 is reset and the output voltage reaches the minimum voltage. The reason for this is that, even if the feedback current $I_0$ is set to the same value, the value of the drive frequency f0 that flows with the feedback current $I_0$ stabilized will differ due to the changes in impedance brought about by the type of load, the environment in which the circuit is used, or the passage of time. In addition, because the set value of the feedback current $I_0$ is changed by the setting level of the luminance of the cold cathode tube, which is the load, the drive frequency will vary despite the load impedance being fixed. In regard to the above-described points, the drive frequencies for all of the above-described conditions must fall within the drive frequency sweep range generated by VCO 18.

Regarding the operation of frequency control circuit 3, the frequency is progressively lowered from frequency f1, at which the output voltage reaches the minimum voltage with integrator 16 having been reset. When the voltage inputted to comparator 15 becomes greater than the reference voltage Vref, the output frequency is fixed and piezoelectric transformer 1 is driven at a fixed frequency. Accordingly, the tube will not turn on with stability unless frequency f1 is set to a frequency that is greater than the drive frequencies, which vary due to impedance of the load or luminance setting described hereinabove.

The solution to the first drawback described hereinabove is to shift f1 to a low frequency, while the solution to the second drawback is to shift f1 to a high frequency to increase the margin, and design of the device has therefore been complicated by these mutually contradictory solutions.

SUMMARY OF THE INVENTION

The object of the present invention is to provide a piezoelectric transformer drive circuit that can solve the above-described problems of the prior art, and that can reduce the generation of heat in the first autotransformer, first switching transistor, second autotransformer, and second switching transistor in cases in which a cold cathode tube has high impedance and does not turn on due to, for example, low ambient temperature, or during a load-open state due to, for example, disconnection.

A piezoelectric transformer drive circuit according to this invention basically has four types of constructions corresponding to claims 1, 5, 9, and 13; and because the output impedance is high and the operation is dependent on the impedance of the load, all of these claims are characterized by the generation of high voltage when the impedance of the load is high, and all relate to devices that drive piezoelectric transformers that use the piezoelectric effect to output an ac voltage inputted from the primary electrodes to the secondary side load.

Explanation will first be given regarding a drive circuit according to the first construction. First autotransformer and second autotransformer input from drive voltage control circuit to their primary terminals; and impress an ac voltage to the primary electrodes of a piezoelectric transformer connected to each of their secondary terminals; and the piezoelectric transformer supplies the generated voltage to load from its secondary electrodes. An intermediate terminal of each of first and second autotransformers is connected to the output terminal of a first switching transistor and second switching transistor, respectively; the intermediate terminal of the first autotransformer further supplies voltage to the drive voltage control circuit; and a frequency divider circuit alternately drives the first and second switching transistors. An output voltage comparison circuit compares the output voltage of the piezoelectric transformer with a prescribed maximum value, and when an overvoltage is detected in output, the output voltage comparison circuit both outputs a reset signal to a frequency control circuit and outputs a duty ratio modification control signal to a dimmer circuit. The dimmer circuit generates a drive halt signal to the drive voltage control circuit to perform duty ratio control and in addition, outputs a control signal to the frequency control circuit so that the frequency of the VCO does not vary while driving is halted. The frequency control circuit outputs a drive signal to a frequency divider circuit, and the drive voltage control circuit inputs the source voltage and controls the peak voltage that drives the piezoelectric transformer to a fixed value. Moreover, in the present invention, duty ratio control can be performed at the dimmer circuit in accordance with the output signal of the output voltage comparison circuit by either varying a dc voltage value that is inputted to a comparator in the dimmer circuit, or by varying a triangular wave minimum voltage value inputted to the comparator, or by varying both of them.

Next, the drive circuit according to the second construction is identical to the above-described drive circuit of the first construction with the exceptions that the drive voltage control circuit of the first construction is omitted and the power source voltage is directly inputted to the primary terminals of the first and second autotransformer, and additionally, a frequency divider control circuit is provided in place of the frequency divider circuit of the first construction. Moreover, the frequency divider control circuit includes, together with a frequency divider circuit, two switches that turn its output ON and OFF, these two switches being respectively connected to the first and second switching transistors and being respectively controlled by the dimmer circuit and the frequency control circuit.

In the drive circuit according to the third construction, a first coil and a second coil are provided in place of the first autotransformer and the second autotransformer of the above-described first construction, and the primary terminals of the first and second coils are connected to the drive voltage control circuit, and the secondary terminals are connected to the primary electrodes of the piezoelectric transformer. The circuit configuration of this construction is otherwise identical to that of the first construction.

Finally, the drive circuit according to the fourth construction is identical to that of the above-described third construction with the exceptions that the drive voltage control circuit of the third construction is omitted and the power source voltage is inputted directly to the primary side terminals of the first and second coils, and in addition, a frequency divider control circuit is provided in place of the frequency divider circuit.

Generally, the output impedance of a piezoelectric transformer is high and its operation depends upon the impedance of the load, with the result that the transformer generates high voltage when the load impedance is high.

A piezoelectric transformer outputs high voltage when a cold cathode tube has high impedance and does not turn on due to such factors as low ambient temperature, or during a load-open state resulting from, for example, disconnection. By taking advantage of such characteristics of a piezoelectric transformer, the following effects can be obtained:

By incorporating an output voltage comparison circuit that outputs a duty ratio switching signal to a dimmer circuit when an overvoltage is detected in the output, the present invention enables switching of the operating duty ratio between a duty ratio for driving the cold cathode tube as the load during normal temperatures and a duty ratio for driving the cold cathode tube in states in which the cold cathode tube has high impedance and will not turn on owing to such factors as low ambient temperature or during a load-open state caused by, for example, disconnection. As shown in FIG. 12, if the duty ratio of the drive circuit is changed and the proportion of ON time reduced, the proportion of time that piezoelectric transformer is driven is also reduced, thereby also reducing the proportion of time that an excessive current flows in the first autotransformer, first switching transistor, second autotransformer, and second switching transistor. In this way, the present invention enables a reduction in the generation of heat in the first autotransformer, first switching transistor, second autotransformer, and second switching transistor in cases in which the cold cathode tube has high impedance and does not turn on due to such factors as low ambient temperature or during a load-open state caused by disconnection.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 3:
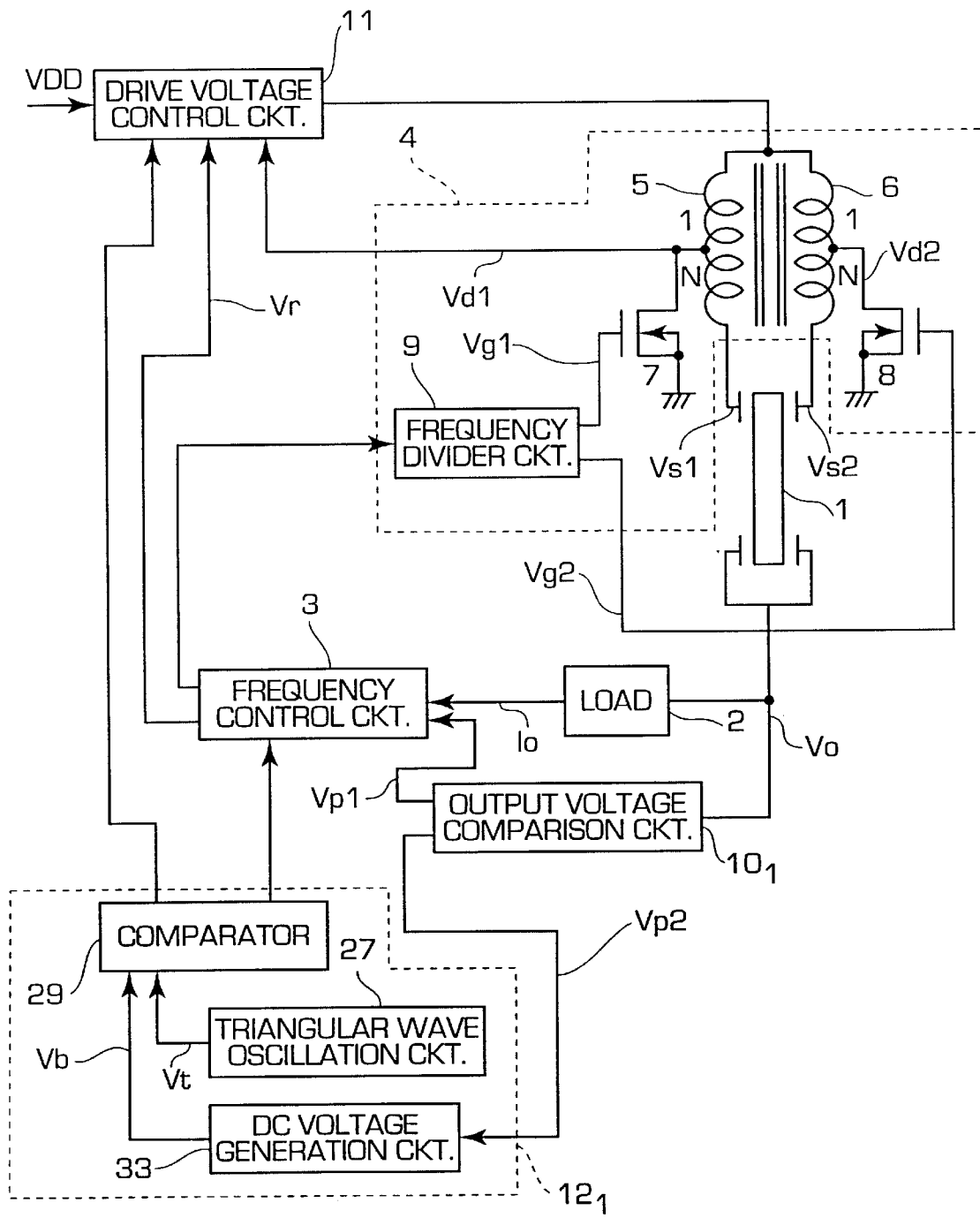
FIG. 3 is a block diagram showing a piezoelectric transformer drive circuit according to the first embodiment of the present invention.
Figure 14:
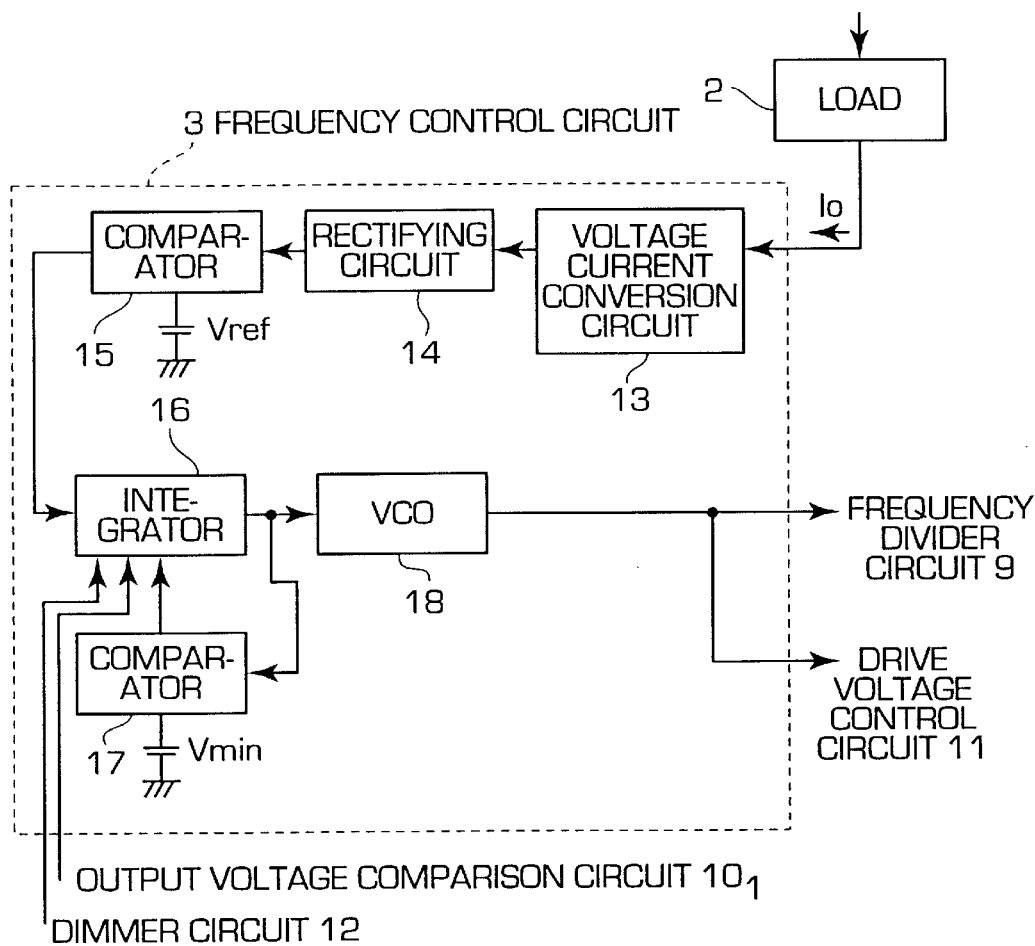
FIG. 14 is a block diagram showing the frequency control circuit of FIG. 3.
Figure 15:
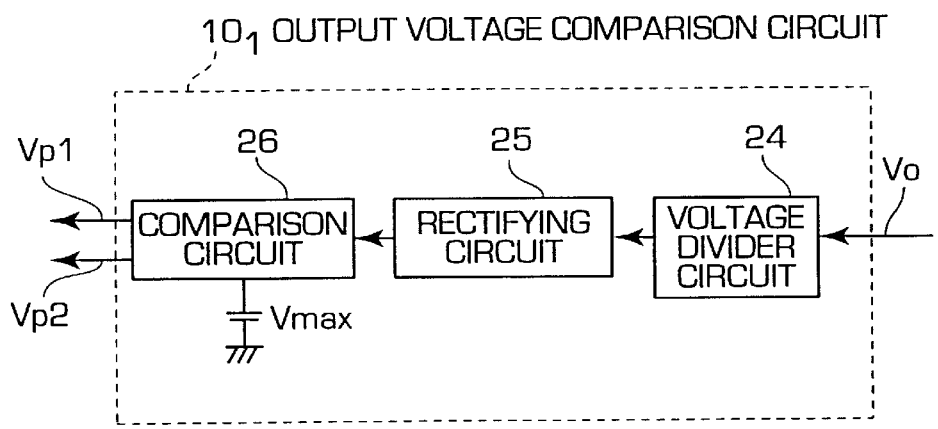
FIG. 15 is a block diagram showing the output voltage comparison circuit of FIG. 3.
Figure 16:
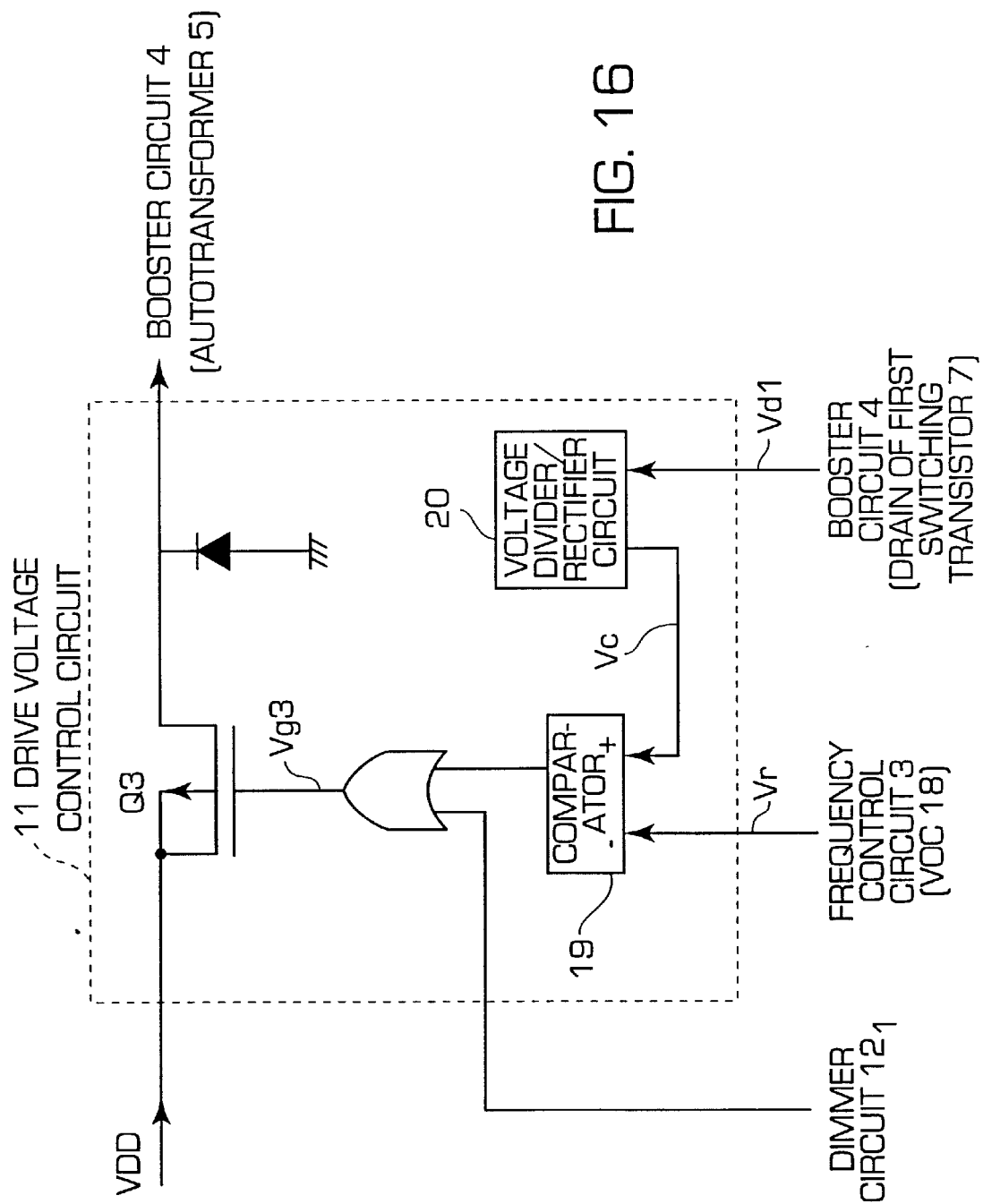
FIG. 16 is a block diagram showing the drive voltage control circuit of FIG. 3.
Figure 17:
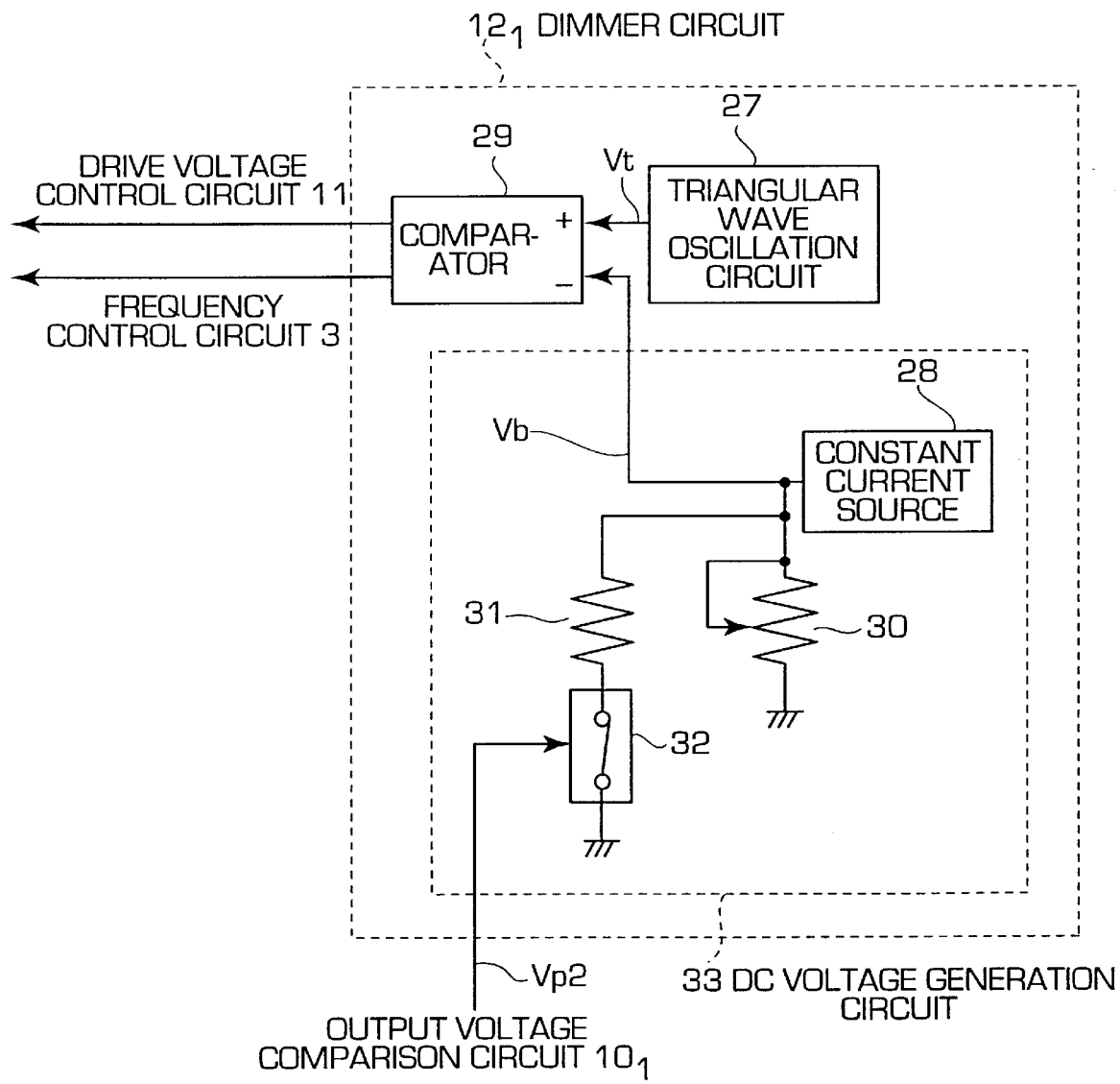
FIG. 17 is a block diagram showing the dimmer circuit of FIG. 3.

FIG. 3 is a block diagram showing the construction of the first embodiment of the present invention (the first type). This embodiment is made up of piezoelectric transformer 1, load 2, frequency control circuit 3, booster circuit 4, autotransformers 5 and 6, switching transistors 7 and 8, frequency divider circuit 9, output voltage comparison circuit $10_1$, drive voltage control circuit 11, and dimmer circuit $12_1$. FIG. 14 is a detailed view of frequency control circuit 3, FIG. 15 is a detailed view of output voltage comparison circuit $10_1$, FIG. 16 is a detailed view of drive voltage control circuit 11, and FIG. 17 is a detailed view of dimmer circuit $12_1$.

Figure 1:
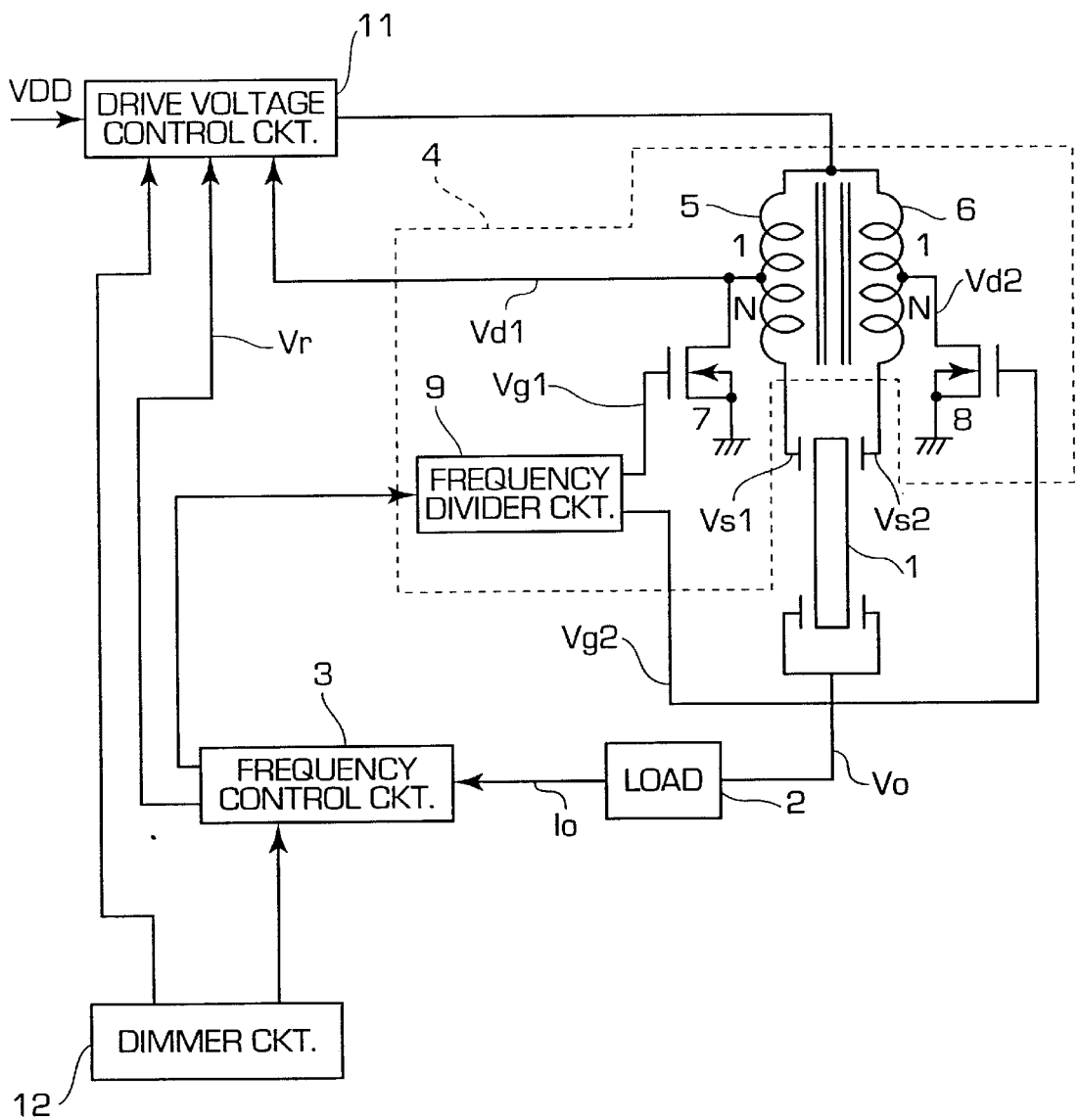
FIG. 1 is a block diagram showing a piezoelectric transformer drive circuit of the prior art.
Figure 2:
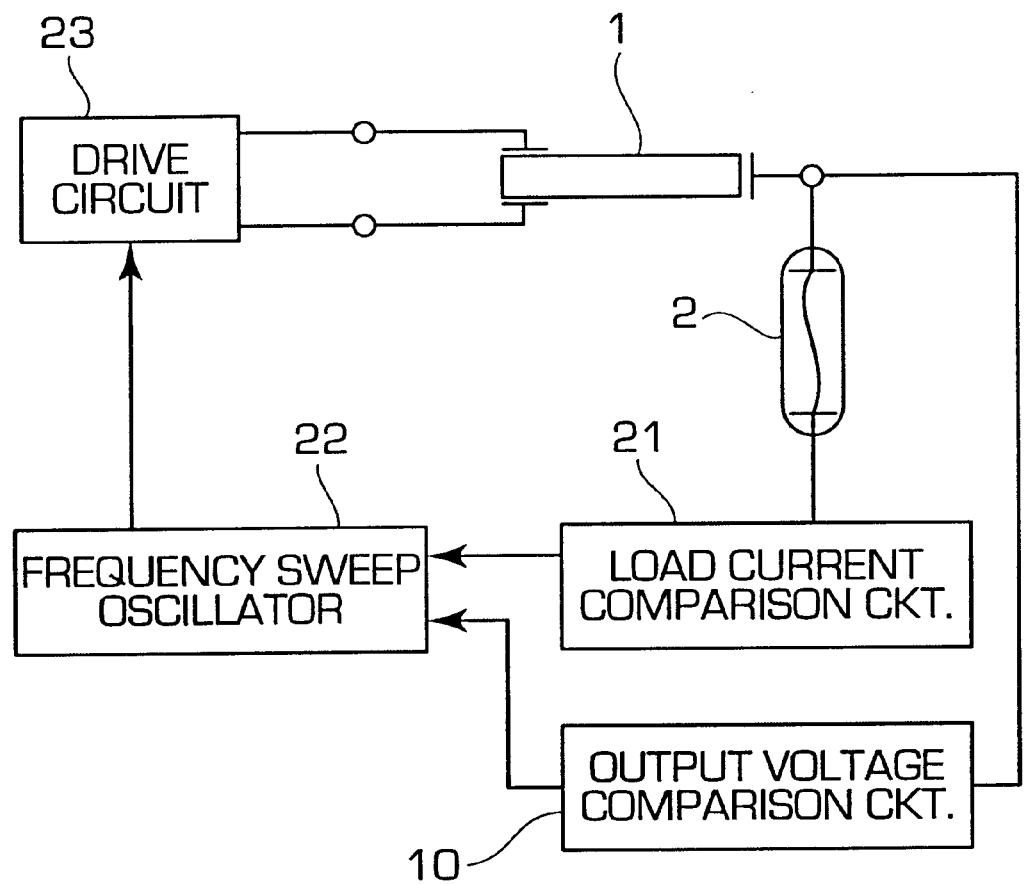
FIG. 2 is a block diagram showing a piezoelectric transformer drive circuit of the prior art that differs from that of FIG. 1.

The constructions of each of the constituent elements of this embodiment are the same as those of the above-described example of the prior art shown in FIG. 1, with the exception of the construction of output voltage comparison circuit $10_1$ and dimmer circuit $12_1$.

Piezoelectric transformer 1 is a third order Rosen-type piezoelectric transformer in which primary electrodes and secondary electrodes are formed on a piezoelectric ceramic in plate form, the primary electrodes being polarized in the direction of thickness, and the secondary electrodes being polarized in the longitudinal direction of the plate. An ac voltage of resonance frequency is impressed to the primary electrodes causing excitation by the piezoelectric effect, and electric power resulting from this mechanical vibration is taken from the secondary electrodes. Due to its high output impedance and operation that is dependent upon the impedance of the load, this piezoelectric transformer 1 is characterized by the generation of high voltage when the load impedance is high.

First autotransformer 5 has its secondary terminal connected to one of the primary electrodes of piezoelectric transformer 1 and its primary terminal connected to the power source; first switching transistor 7 has its output terminal connected to an intermediate terminal of first autotransformer 5; second autotransformer 6 has its secondary terminal connected to the other of the primary electrodes of piezoelectric transformer 1 and its primary terminal connected to the power source; and second switching transistor 8 has its output terminal connected to an intermediate terminal of second autotransformer 6. First switching transistor 7 and second switching transistor 8 alternately enter an ON state in accordance with two clocks of opposite phase outputted from frequency divider circuit 9. Booster circuit 4 is made up of first autotransformer 5, first switching transistor 7, second autotransformer 6, second switching transistor 8, and frequency divider circuit 9.

Frequency control circuit 3 has the function of outputting a drive signal to frequency divider circuit 9, and drive voltage control circuit 11 has the function of uniformly controlling the peak value of the drain voltage of first switching transistor 7. When the cold cathode tube has high impedance and will not turn on due to factors such as low ambient temperature, or during load-open states caused by disconnection, load impedance is high and the output voltage of piezoelectric transformer 1 is therefore greater than when connected to a cold cathode tube having the impedance immediately following 100 KΩ at the same drive frequency. For the purpose of preventing breakdown of piezoelectric transformer 1, output voltage comparison circuit $10_1$ has the function of both outputting a reset signal to frequency control circuit 3 and outputting a control signal to dimmer circuit $12_1$ to modify the duty ratio when overvoltage is detected in the output.

Figure 13:
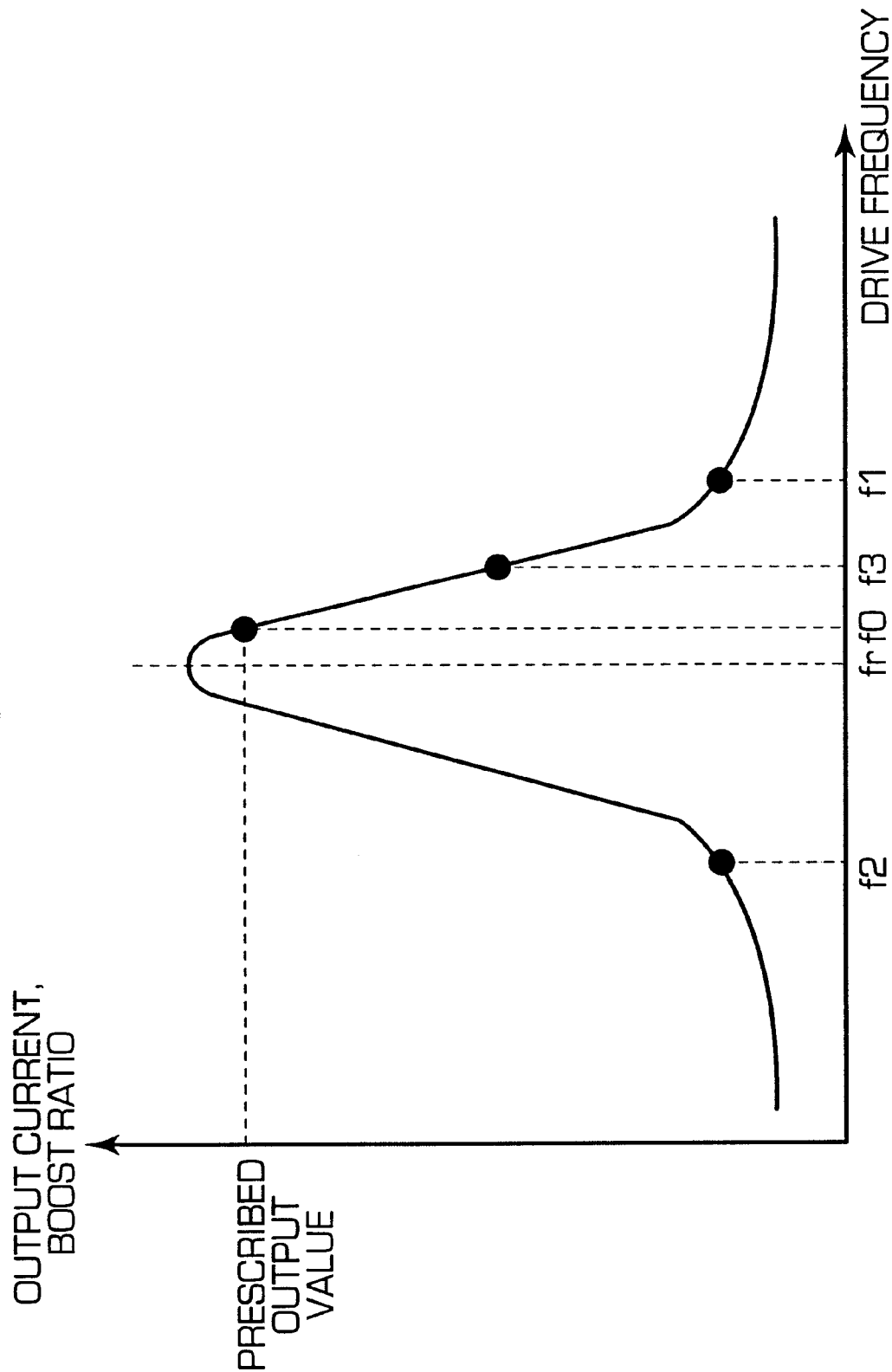
FIG. 13 is a characteristics chart illustrating the operation of the frequency control circuit.
Figure 18:
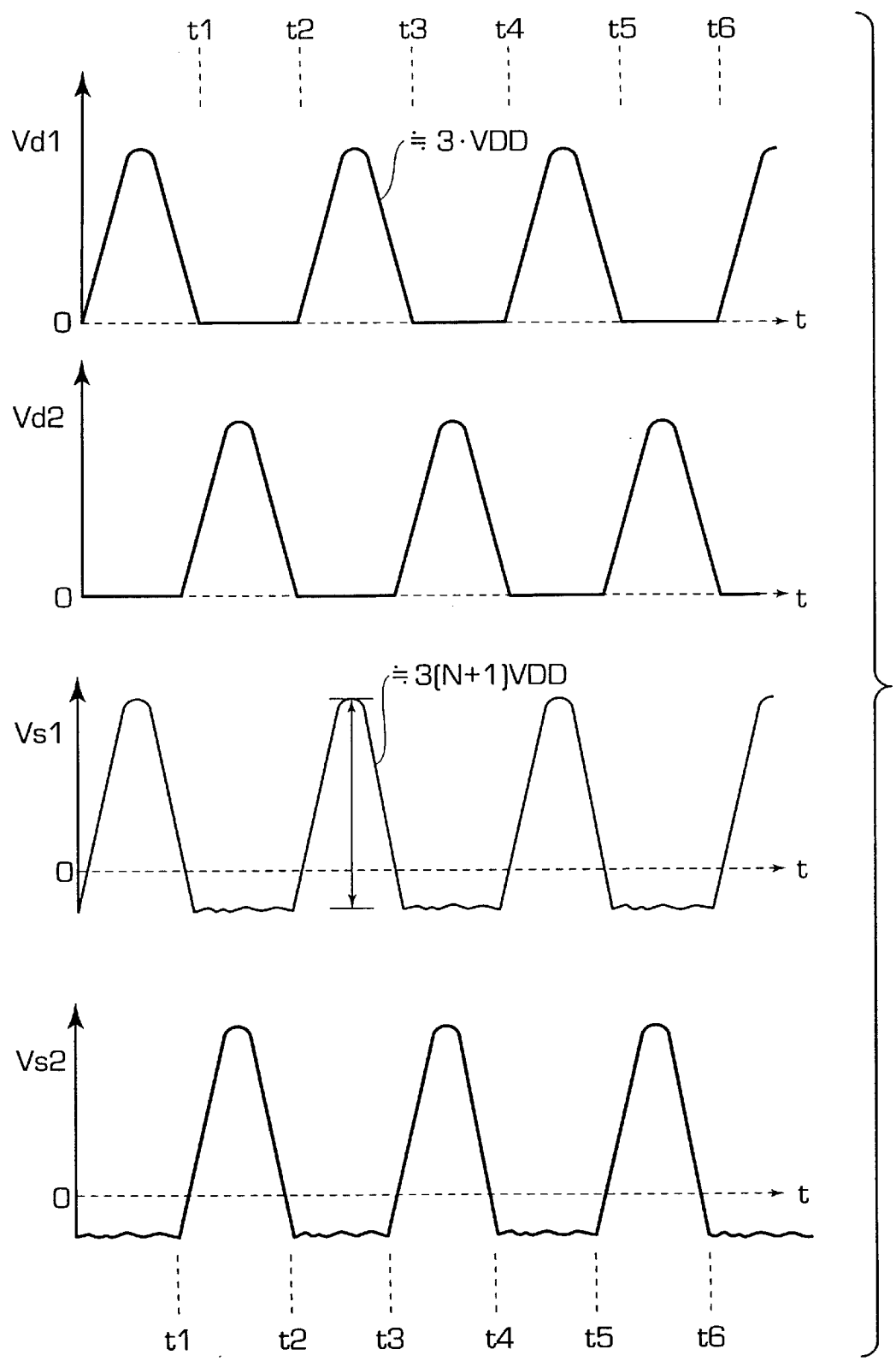
FIG. 18 is a intermediate/output voltage waveform chart for the autotransformer of the first embodiment shown in FIG. 3.

Explanation will next be presented regarding the operation of each block of the first embodiment. First switching transistor 7 and second switching transistor 8 alternately turn ON in accordance with clocks of opposite phase outputted from frequency divider circuit 9, and current flows from power source VDD to the primary side of first autotransformer 5 and second autotransformer 6 by way of drive voltage control circuit 11 and is charged as current energy. When first switching transistor 7 and second switching transistor 8 turn OFF, the charged energy is discharged and a voltage higher than the power source voltage is generated as voltage energy. Voltage Vd1 generated in the drain of first switching transistor 7 and voltage Vd2 generated in the drain of second switching transistor 8 reach a peak voltage of approximately three times that of the power source voltage VDD (V). Vd1 and Vd2 are converted to voltage at the secondary side of first autotransformer 5 and the secondary side of second autotransformer 6 in proportion to the turn ratio N of the windings of these autotransformers, and each voltage is inputted to the respective primary electrode of piezoelectric transformer 1. At frequency f0 shown in FIG. 13, the piezoelectric transformer input voltage waveforms Vs1 and Vs2 and the switching transistor drain voltage waveforms Vd1 and Vd2 shown in FIG. 18 voltage-resonate in accordance with the equivalent input capacitance of piezoelectric transformer 1 and load 2 and the total inductance of the primary side inductance and secondary side inductance of a electromagnetic transformer, and are set to become the half-wave of a sine wave that reaches zero voltage in the time interval of one-half the resonance cycle of piezoelectric transformer 1.

As shown in FIG. 14, frequency control circuit 3 is made up of current/voltage conversion circuit 13, rectifying circuit 14, comparator 15, integrator 16, comparator 17, and VCO 18. At current/voltage conversion circuit 13, current $I_0$ fed back from load 2 is converted to voltage that is voltage-divided according to the ratio of its resistance value, converted to a dc voltage at rectifying circuit 14, and inputted to comparator 15. The inputted voltage is compared with a reference voltage Vref at this comparator 15, and if the inputted voltage is smaller, a signal that cuts off the discharge path of integrator 16 is outputted to integrator 16. Integrator 16 is constructed such that the output voltage is boosted at a fixed rate during the time of input of the signal that cuts off the discharge path, and this output voltage is inputted to VCO 18. VCO 18 is a voltage-controlled oscillator that outputs a triangular wave voltage of a frequency that is in inverse proportion to the inputted voltage value, this frequency is frequency-divided by frequency divider circuit 9, and piezoelectric transformer 1 is driven at a frequency that is one-half the oscillation frequency of VCO 18. As a result, when a voltage that is lower than the reference voltage Vref is inputted to comparator 15, the drive frequency of piezoelectric transformer 1 continues to drop. The drive frequency of piezoelectric transformer 1 is set to drop from f1 shown in FIG. 13, and as a result, the drive frequency approaches the resonance frequency fr of piezoelectric transformer 1, the boost ratio of piezoelectric transformer 1 increases, and the output current of piezoelectric transformer 1 increases over time.

The upper limit frequency f1 and lower limit frequency f2 of the oscillation frequency sweep range of frequency divider circuit 9 are set by the constants of the resistors and capacitors within VCO 18 circuit. Frequency divider circuit 9 is a block having output terminals for the two countering signals, output voltage Vg1 and Vg2. The output voltage of VCO 18 of frequency control circuit 3 is inputted, and inversion of the two output voltages is repeated with each input of these pulses.

Figure 19:
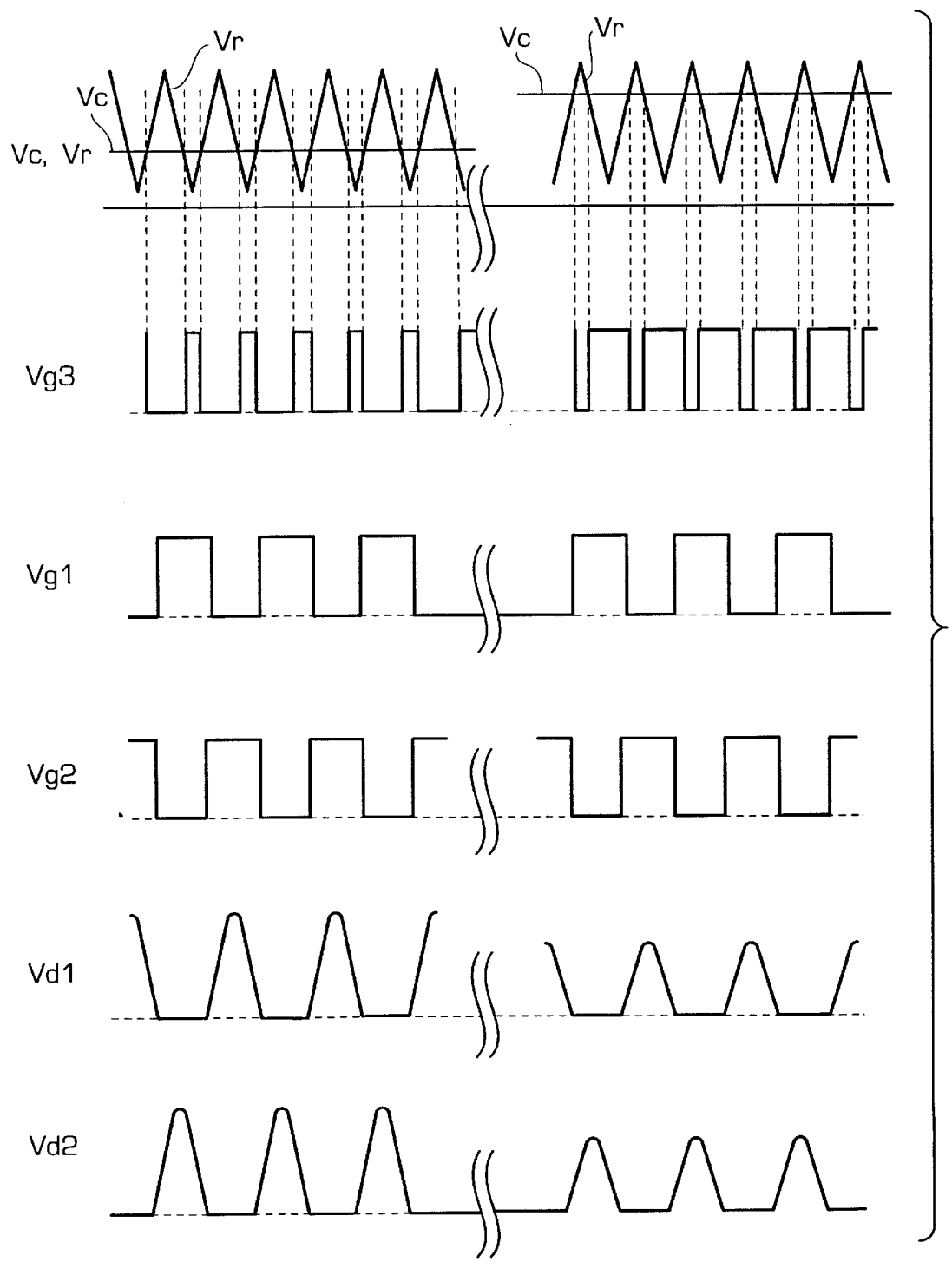
FIG. 19 is a timing chart illustrating the operation of the drive voltage control circuit of FIG. 3.

FIG. 16 shows a detailed view of drive voltage control circuit 11. As shown in FIG. 16, drive voltage control circuit 11 is a circuit in which the drain voltage waveform Vd1 of first switching transistor 7 is voltage-divided and rectified at voltage divider/rectifier circuit 20 and inputted to the non-inverted input terminal of comparator 19, the triangular wave Vr, a frequency twice the drive frequency generated at VCO 18, is inputted to the inverted input terminal of comparator 19, and the result of comparison of these two inputs is inputted to the gate of p-channel power MOSFET Q3. FIG. 19 is a timing chart showing the action of voltage Vc, which is the voltage-divided and rectified drain voltage waveform Vd1; triangular waveform Vr of the drive frequency generated at frequency control circuit 3; Q3 gate voltage Vg3, frequency divider circuit output voltages Vg1 and Vg2; first switching transistor drain voltage waveform Vd1, and second switching transistor drain voltage waveform Vd2. When the drain voltage is high, non-inverted input terminal voltage Vc increases, and the greater the voltage Vc inputted to comparator 19, the greater the proportion of time that Q3 gate voltage Vg3 is outputted. The time of the open state between the source and drain of Q3 thus lengthens and the input power to booster circuit 4 decreases, and control is therefore performed to lower the switching transistor drain voltages Vd1 and Vd2. When the drain voltage is low, non-inverted input terminal voltage Vc decreases, and the lower the voltage Vc inputted to comparator 19, the smaller the proportion of time that Q3 gate voltage Vg3 is outputted. The time of the open state between the source and drain of Q3 thus decreases and the input power to booster circuit 4 increases, and control is therefore performed to increase the switching transistor drain voltages Vd1 and Vd2. The switching transistor drain voltages Vd1 and Vd2 are controlled to a fixed voltage value by this continuous control, and a means is therefore achieved for maintaining the voltage that drives the piezoelectric transformer at a fixed level.

As shown in FIG. 15, output voltage comparison circuit $10_1$ is made up of voltage divider circuit 24, rectifier circuit 25, and comparator circuit 26. Voltage $V_O$ outputted from the secondary side electrodes of piezoelectric transformer 1 is voltage-divided by its resistance ratio at voltage divider circuit 24, converted to dc voltage at rectifier circuit 25, and inputted to comparator circuit 26. The inputted voltage is compared with reference voltage Vmax at comparator circuit 26, and two signals Vp1 and Vp2 are outputted if the inputted voltage is greater than Vmax. Output signal Vp1 resets integrator 16 of frequency control circuit 3, and the output voltage of integrator 16 becomes the minimum voltage. Output signal Vp2 is output that has a time constant, and once the output of comparator 26 becomes high level, signal Vp2 continues to be outputted for a time equal to the time necessary for the output of integrator 16 to change from the minimum voltage to the maximum voltage. If the setting of the resistance ratio of voltage divider 24 is greater than this level, the output voltage $V_O$, which is at a level causing degradation of the characteristics of piezoelectric transformer 1, is made to equal the reference voltage Vmax after passage through rectifier circuit 25.

Figure 20:
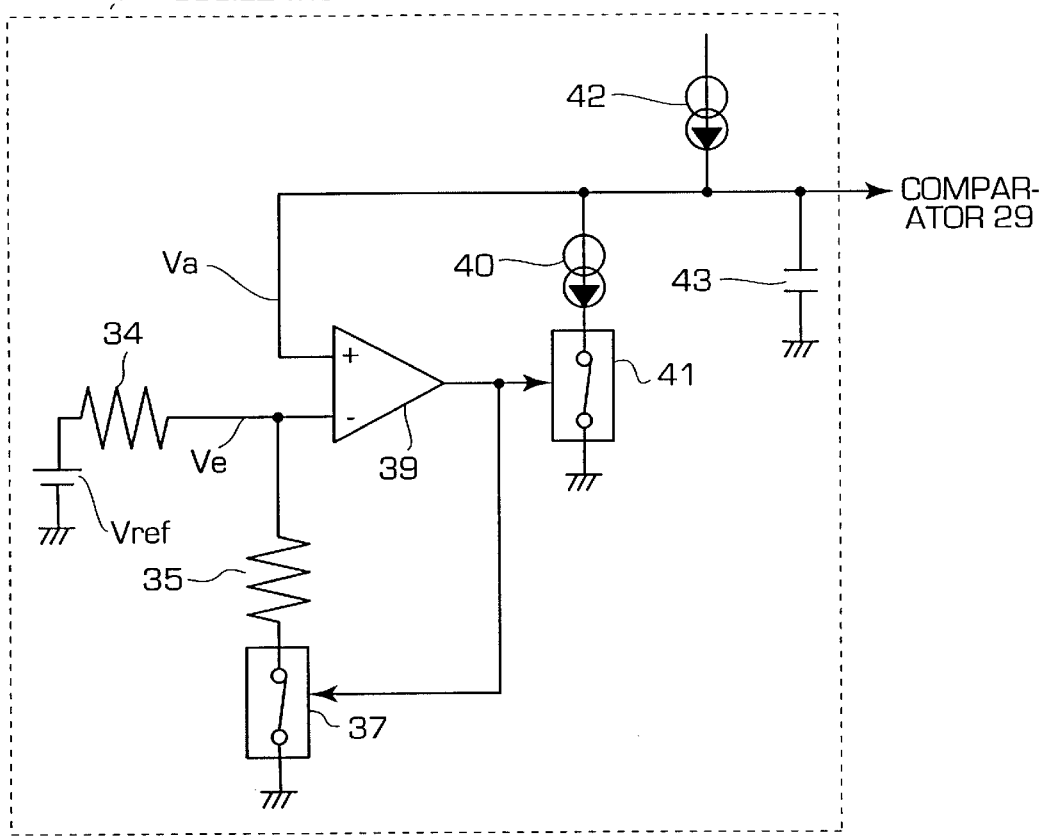
FIG. 20 is a block diagram showing the triangular wave oscillation circuit of FIG. 3.
Figure 21:
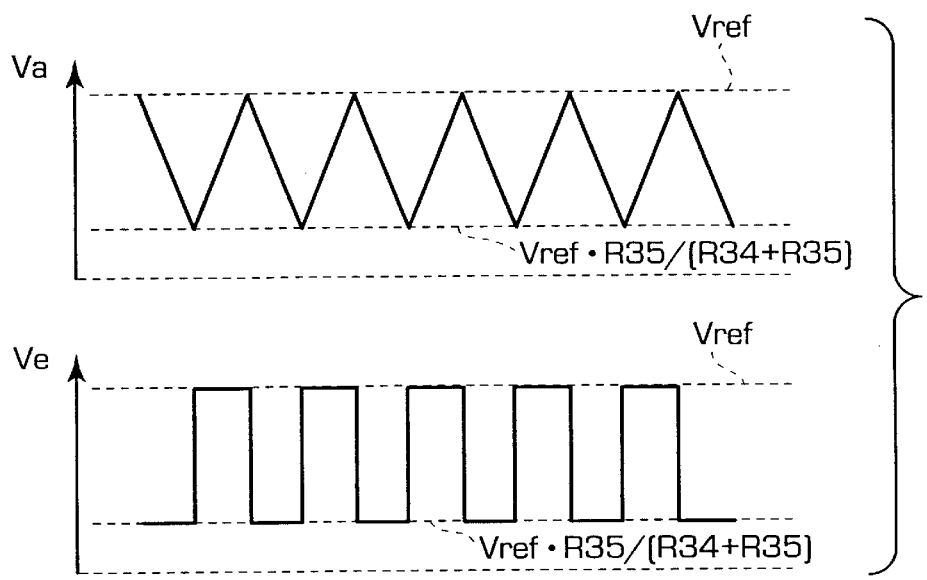
FIG. 21 is a timing chart illustrating the operation of the triangular wave oscillation circuit.

As shown in FIG. 17, dimmer circuit $12_1$ is made up of triangular wave oscillation circuit 27 that oscillates the dimmer frequency, comparator 29, constant-current source 28, dimmer volume 30, fixed resistance 31 in parallel connection with dimmer volume control 30, and switch 32. Triangular wave oscillation circuit 27 is shown in FIG. 20. In triangular wave oscillation circuit 27, constant-current source 42 and constant-current source 40, which is capable of supplying a current twice that of constant-current source 42, cause capacitor 43 to charge and discharge, thereby determining the output value. The triangular wave which is the output establishes a frequency that is far smaller than the drive frequency of the piezoelectric transformer. FIG. 21 shows a timing chart of the inverted input terminal voltage value of comparator 39 and the non-inverted input terminal voltage, which is the output value, of comparator 39. The maximum value of the triangular wave is determined by the value of Vref, and the minimum value of the triangular wave is determined by Vref and the values of voltage divider resistors 34 and 35.

In FIG. 17, the current flowing from constant-current source 28 flows to ground by way of dimmer volume control 30. The voltage inputted to comparator 29 is determined by the resistance value at this time. This voltage and the output waveform of the output of triangular wave oscillator 27 are compared at comparator 29, and a pulse signal taking the duty as variable is outputted. This signal is connected to frequency control circuit 3 and drive voltage control circuit 11, and during the interval of high level, the signal turns Q3 OFF and halts the drive of piezoelectric transformer 1, and in addition, serves to hold the output voltage of integrator 16 such that the frequency of VCO 18 does not vary. The voltage inputted to comparator 29 is changed by varying the resistance of dimmer volume control 30, thereby also varying the duty ratio of the output of comparator 29. Switch 32 exercises ON and OFF control in accordance with the output Vp2 of output voltage comparison circuit $10_1$, the switch entering an ON state when Vp2 is high level.

Explanation will next be presented regarding the overall operation of the circuit of the first embodiment of the present invention. Piezoelectric transformer input voltages Vs1 and Vs2 are alternately inputted to the primary electrodes of piezoelectric transformer 1, which is equivalent to the waveform of a sine wave oscillating piezoelectric transformer 1 as a drive voltage, and an output voltage of the boost ratio times, which is determined by the form of piezoelectric transformer 1, is outputted from the secondary electrodes. This voltage $V_O$ is impressed to the load, and current $I_O$, which is fed back through the load, is inputted to frequency control circuit 3. Frequency control circuit 3 generates a frequency and transmits it to frequency divider circuit 9, which divides the frequency to produce a drive frequency for piezoelectric transformer 1. This drive frequency drops from f1 at a fixed rate, and at drive frequency f0, the voltage inputted to comparator 15 becomes greater than reference voltage Vref, and comparator 15 outputs to integrator 16 a signal that resets the discharge path. The output signal of integrator 16 thus holds unchanged the voltage immediately preceding resetting of the discharge path, the output frequency of VCO 18 is made uniform, and piezoelectric transformer 1 is driven at a fixed frequency.

Following the start of driving of piezoelectric transformer 1 at a fixed frequency, if feedback current $I_O$ should fluctuate due to any cause, such as fluctuation in impedance of the cold cathode tube, and the input voltage of comparator 15 should fall below the reference voltage Vref, comparator 15 outputs a signal that cuts off the discharge path of integrator 16 and the drive frequency decreases. Upon reaching frequency f2, the input to comparator 17, which is the output of integrator 16, exceeds reference voltage Vmin and outputs a reset signal to integrator 16. Integrator 16 is reset, the output voltage becomes the minimum voltage, VCO 18 enters a state in which frequency f1 is outputted, and the above-described operations are repeated. Among these operations, if a frequency is found at which the input voltage of comparator 15 equals the voltage of Vref, the output voltage of integrator 16 is held unchanged at that voltage and the output frequency of VCO 18 is fixed.

Figure 12:
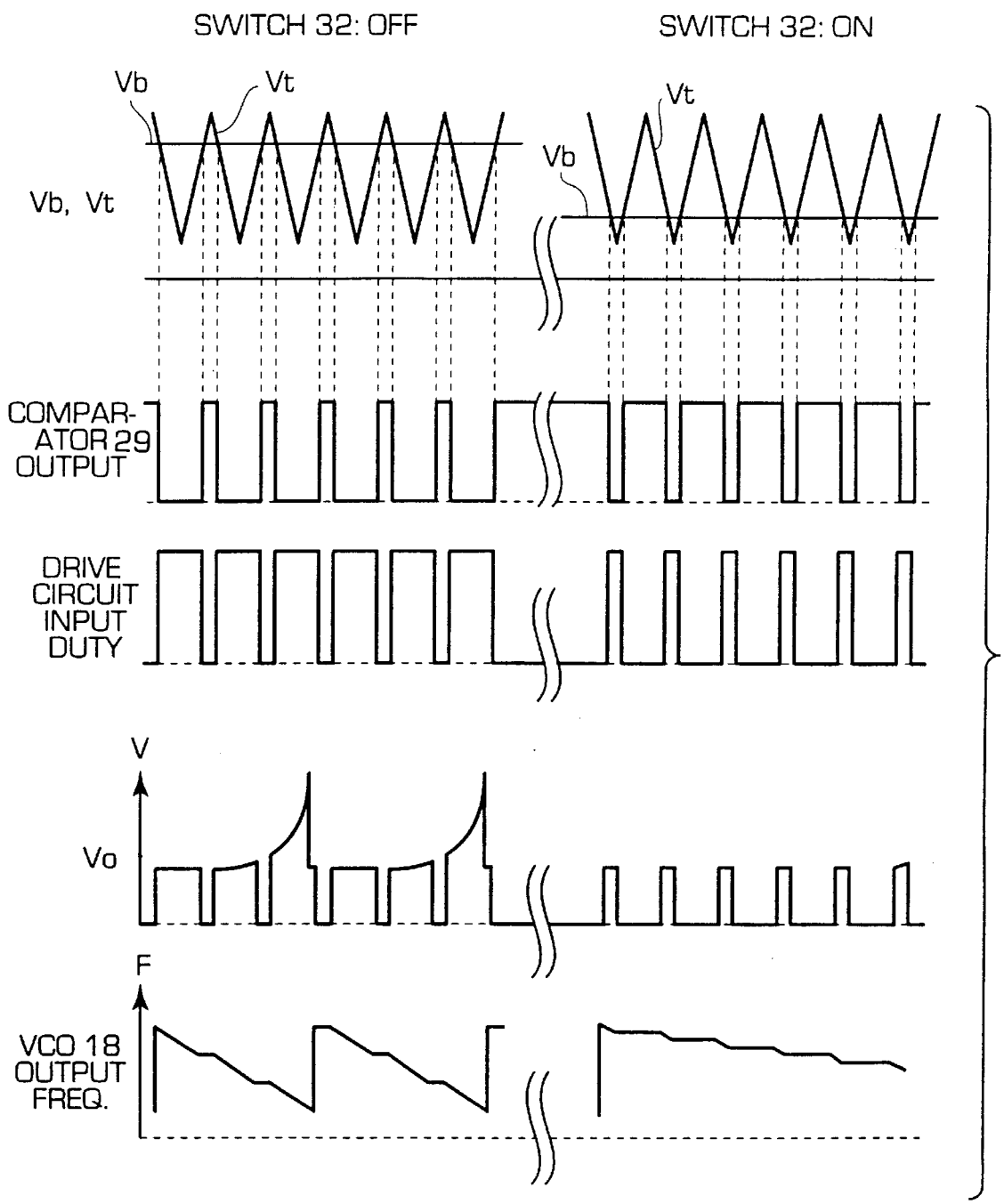
FIG. 12 is a timing chart of each type of signal for illustrating the operation of the piezoelectric transformer drive circuit shown in FIG. 3.

When conditions such as low ambient temperature raise the impedance of the cold cathode tube and prevent start up, or during a load-open state caused by, for example, disconnection, load impedance is high and the drive frequency continues to fall as described hereinabove. The output voltage $V_O$ of piezoelectric transformer 1 is high because the load impedance is high, and at frequency f3, the voltage inputted to comparison circuit 26 of output voltage comparison circuit $10_1$ exceeds the reference voltage Vmax and signals Vp1 and Vp2 are outputted. Output of Vp1 causes the frequency to return to f1. Output of Vp2 causes switch 32 to turn ON, and current discharged from constant-current source 28 is shunted between dimmer volume 30 and fixed resistance 31. Accordingly, the input dc voltage Vb of comparator 29 is a lower voltage when Vp2 is inputted and switch 32 is ON than when Vp2 is not inputted and switch 32 is OFF. Output Vt of triangular wave oscillation circuit 27 is not affected by the level of Vp2, and therefore, the proportion of time of high level of the output of dimmer circuit $12_1$ is greater when Vp2 is high level, and the proportion of time of an OFF state between the source and drain of Q3 is greater. The output of dimmer circuit $12_1$ is also connected to frequency control circuit 3 and holds the frequency of VCO 18 during the time that the drive circuit is halted. When the drive circuit again begins to operate, it is controlled so as to begin decreasing from the VCO frequency immediately preceding the halt. This relation is shown in FIG. 12. Vp2 is an output that has a time constant, and once the output of comparison circuit 26 reaches high level, output of Vp2 is continued for an interval equal in length to the time necessary for the output of integrator 16 to change from minimum voltage to the maximum voltage, and as a result, this state is maintained as long as a state in which a cold cathode tube has high impedance and fails to turn on due to factors such as low ambient temperature, or a load-open state caused by, for example, disconnection.

Accordingly, through use of a piezoelectric transformer drive circuit according to the present invention, overvoltage of the output voltage of piezoelectric transformer 1 can be detected when driving piezoelectric transformer 1 in a state in which a cold cathode tube has high impedance and does not turn on due to, for example, low ambient temperature, or a load-open state caused by, for example, disconnection, whereby the input duty to the drive circuit is lowered and the amount of current per time unit flowing to first autotransformer 5, first switching transistor 7, second autotransformer 6, and second switching transistor 8 can be decreased to reduce the generation of heat in these components.

Figure 4:
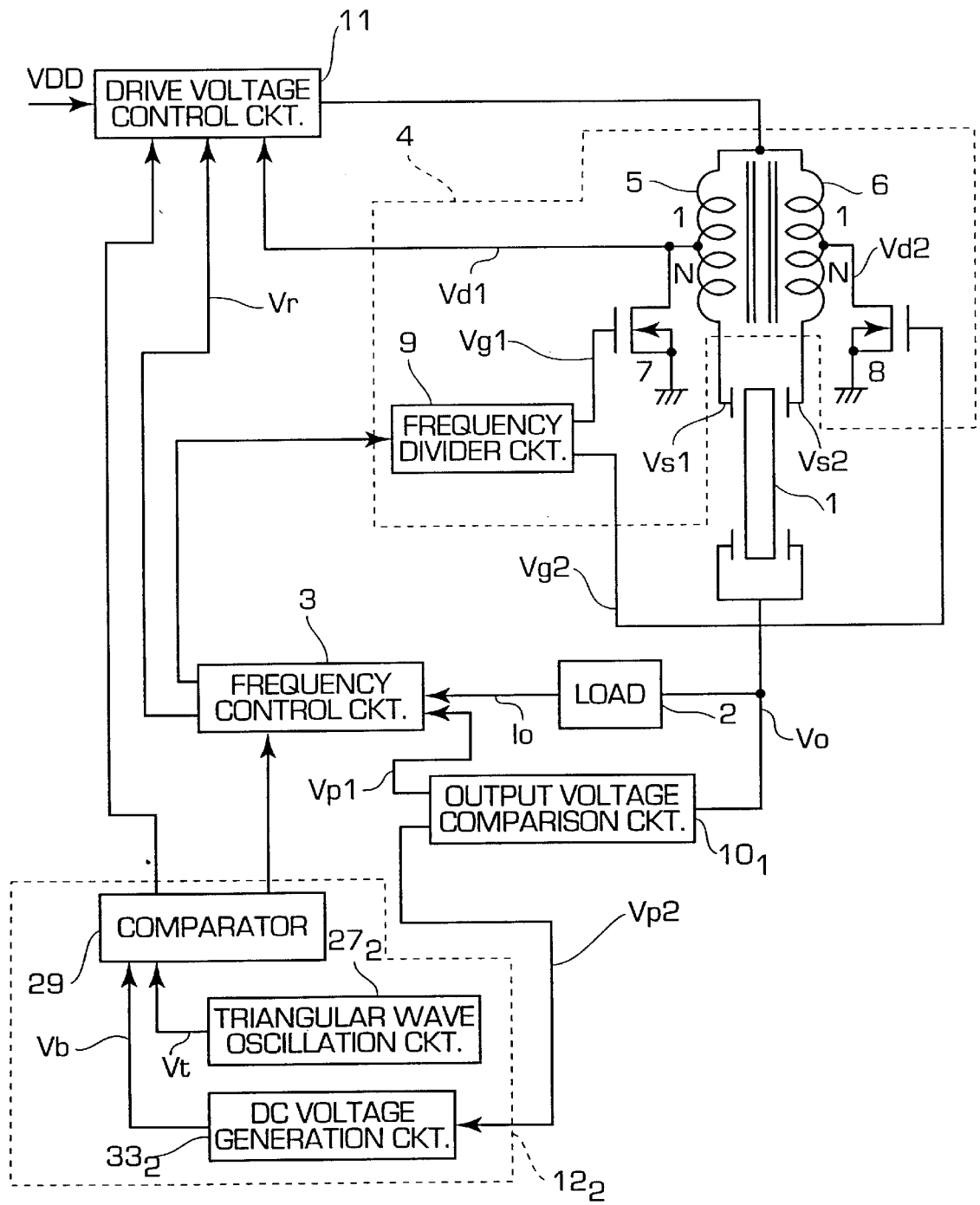
FIG. 4 is a block diagram showing a piezoelectric transformer drive circuit according to the second embodiment of the present invention.
Figure 22:
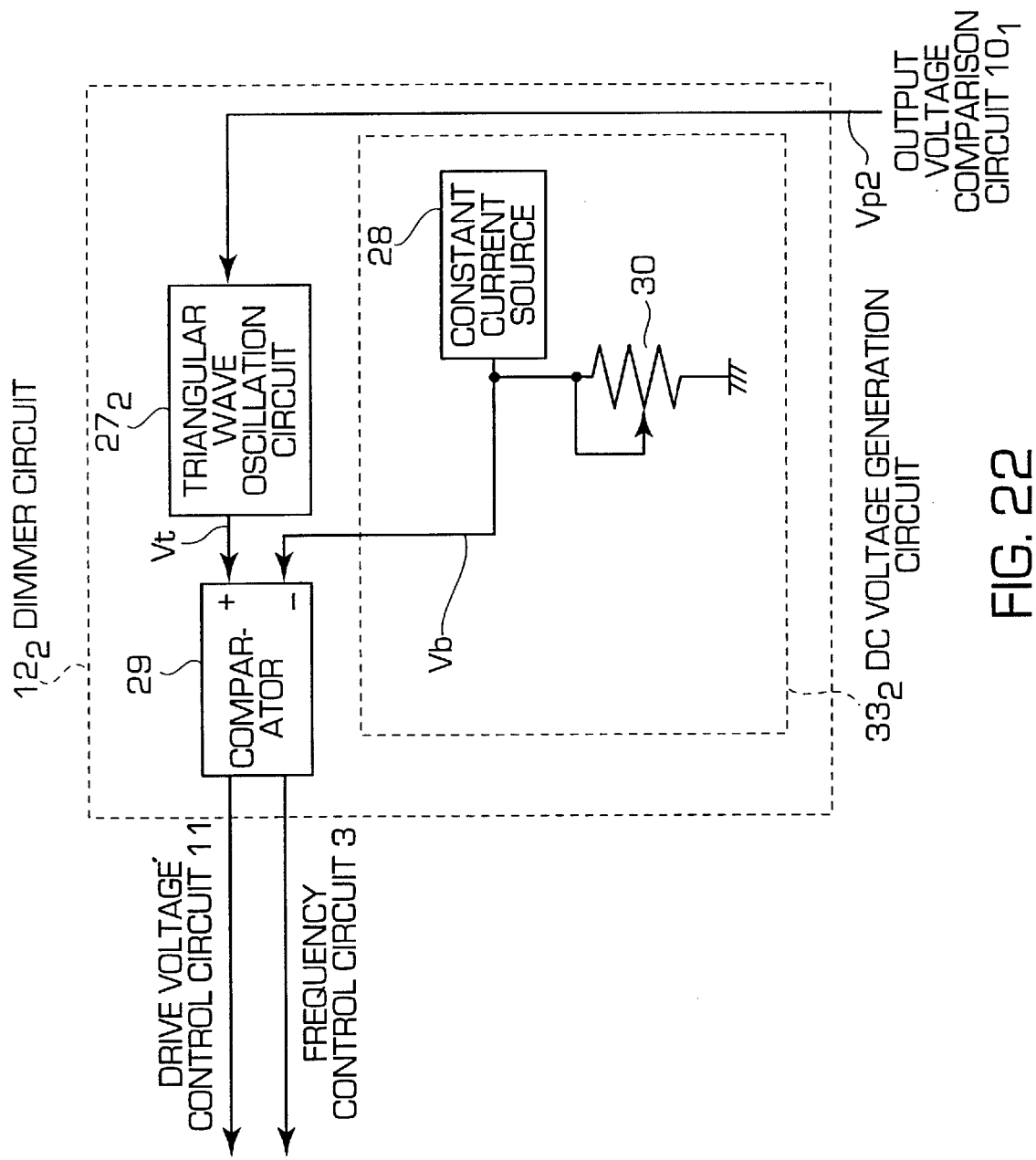
FIG. 22 is a block diagram showing the dimmer circuit of FIG. 4.
Figure 23:
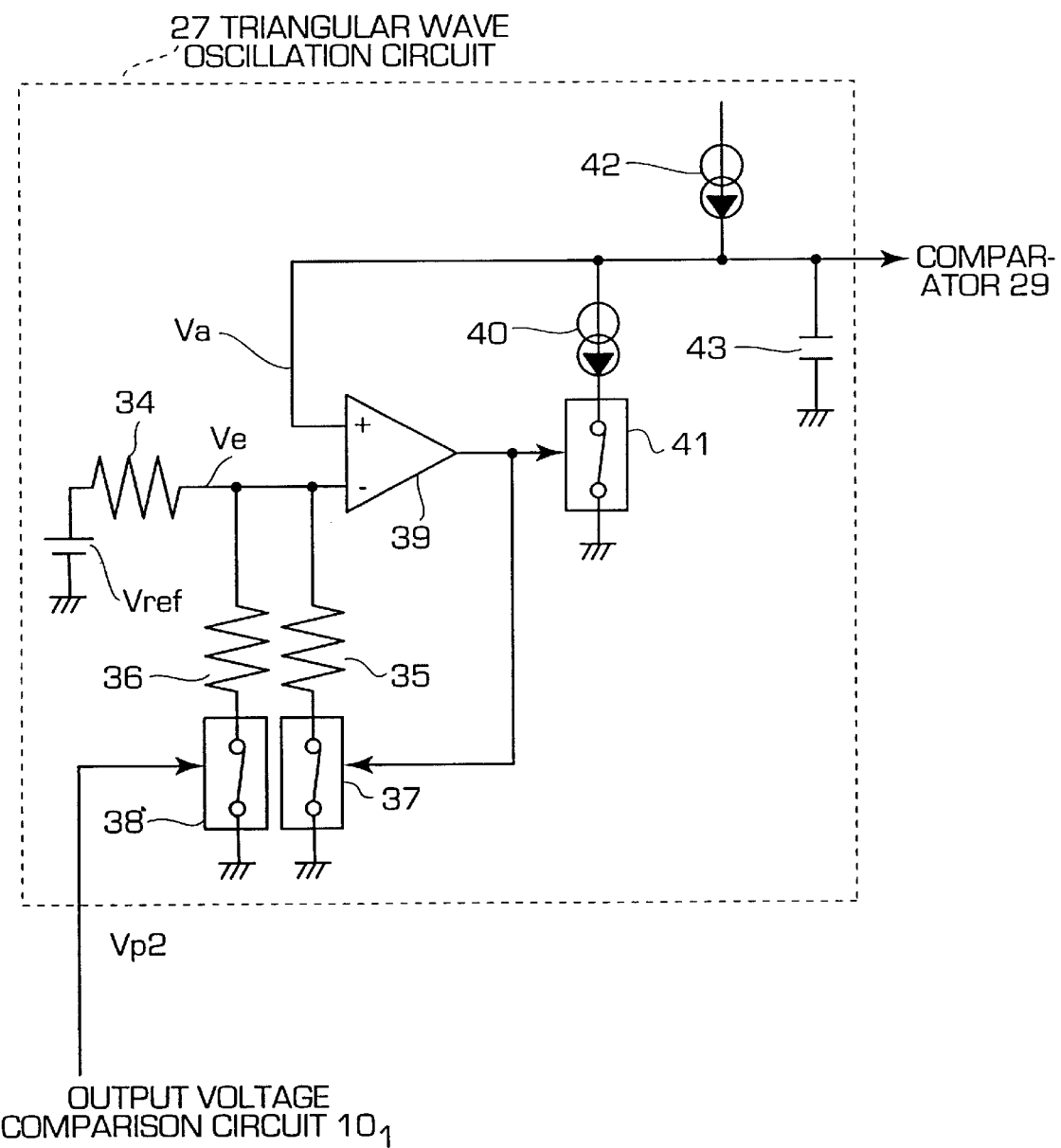
FIG. 23 is a circuit diagram showing the triangular wave oscillation circuit of FIG. 4.

FIG. 4 is a block diagram showing the construction of the second embodiment of the present invention. This embodiment is identical to the first embodiment shown in FIG. 3 with the exception that output Vp2, which controls dc voltage generation circuit $33_2$ from output voltage comparison circuit $10_1$, is eliminated and output $Vp_2$ controls triangular wave oscillation circuit $27_2$ of dimmer circuit $12_2$. FIG. 22 is a block diagram showing this dimmer circuit $12_2$, and FIG. 23 is a circuit diagram showing triangular wave oscillation circuit $27_2$.

Next, regarding the operation of the second embodiment of this invention, in a state in which cold cathode tube has high impedance and does not turn on due to, for example, low ambient temperature, or in a load-open state due to, for example, disconnection, the output of comparator 15 of frequency control circuit 3 becomes a signal that cuts off the discharge path of integrator 16, and the drive frequency continues to drop at a fixed rate. If output voltage comparison circuit $10_2$ detects overvoltage at frequency f3, it outputs signals Vp1 and Vp2. By the output of Vp1, integrator 16 is reset, the output voltage of integrator 16 becomes the minimum voltage, and the output of VCO 18 enters a state such that frequency divider circuit 9 outputs frequency f1. The drive frequency again falls at a fixed rate from this frequency f1, and the above-described operation is repeated. Switch 38 of triangular wave oscillation circuit $27_2$ is set to turn ON when the output of Vp3 is low level and turn OFF when the output of Vp2 is high level.

Figure 24:
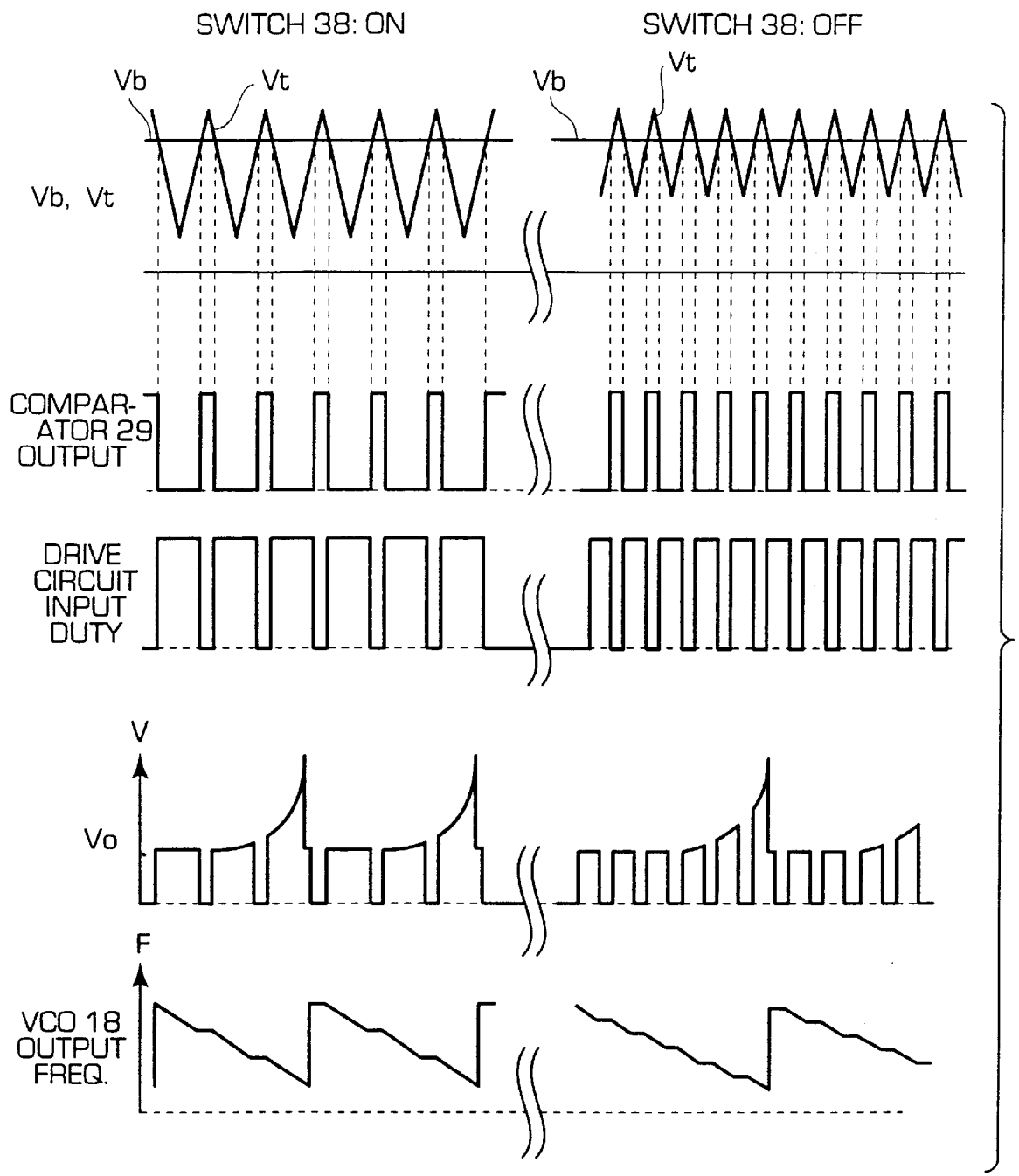
FIG. 24 is a timing chart of each type of signal for illustrating the operation of the FIG. 4.

As in the case of the first embodiment shown in FIG. 21, the minimum voltage of the triangular wave outputted by triangular wave oscillation circuit $27_2$ is determined by the voltage division ratio of resistors 34 and 35, and the minimum voltage of the triangular wave therefore increases by turning switch 38 OFF. FIG. 24 shows the relations between Vb and Vt, the output duty ratio of comparator 29, the input duty ratio of drive voltage control circuit 11, $V_0$, and the output frequency of VCO 18 when switch 38 is turned ON and when switch 38 is turned OFF. By turning switch 38 OFF, the duty ratio of drive voltage control circuit 11 is decreased; the amount of current per time unit flowing to first autotransformer 5, first switching transistor 7, second autotransformer 6, and second switching transistor 8 is reduced; and the generation of heat in these components can be decreased. When switch 38 is ON, the oscillation frequency of triangular wave oscillation circuit $27_2$ becomes high, but during this interval, the cold cathode tube, which is the load, either does not turn on or blinks on and off and therefore does not pose a practical problem despite variation in the dimmer frequency.

Figure 5:
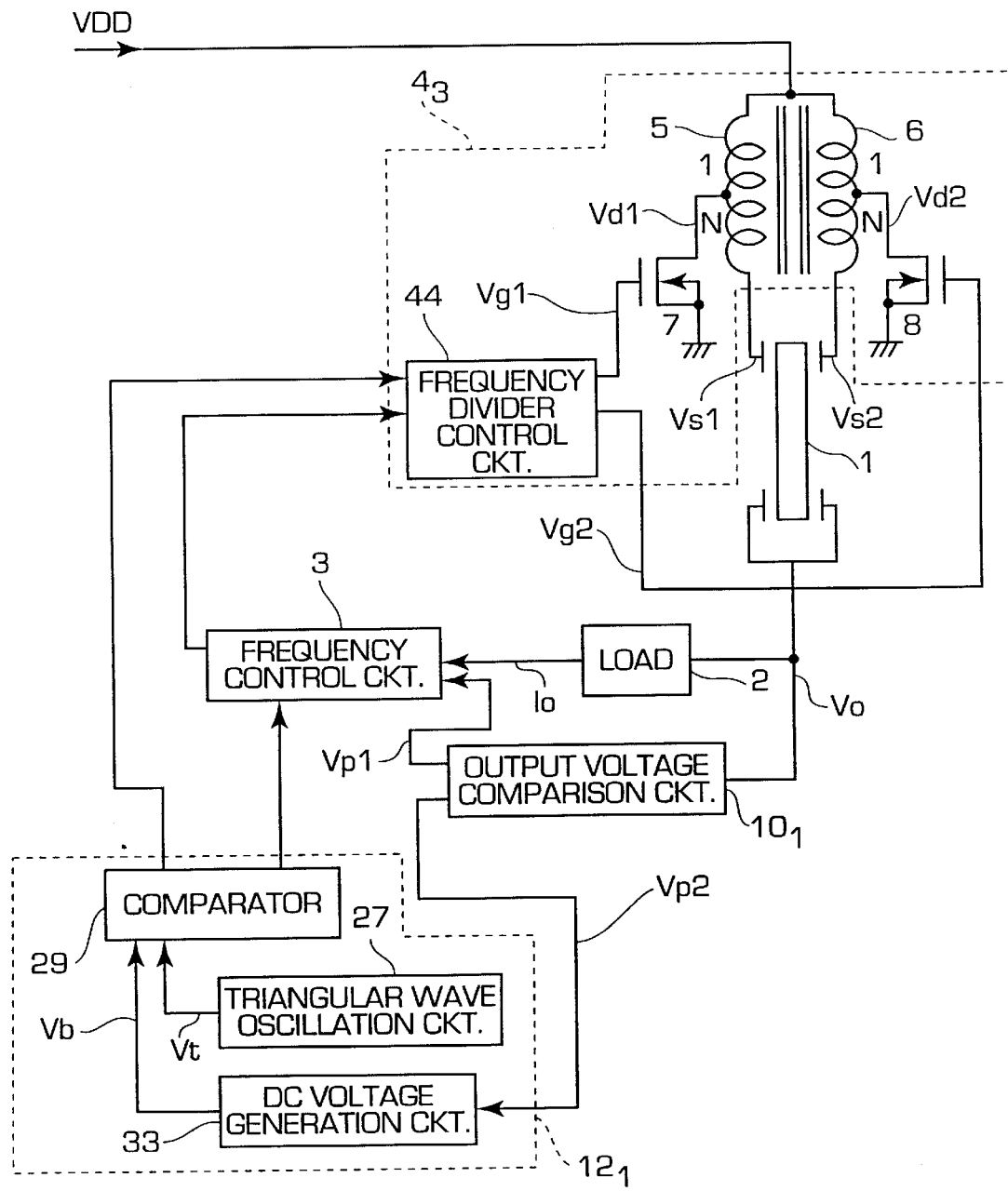
FIG. 5 is a block diagram showing a piezoelectric transformer drive circuit according to the third embodiment of the present invention.
Figure 25:
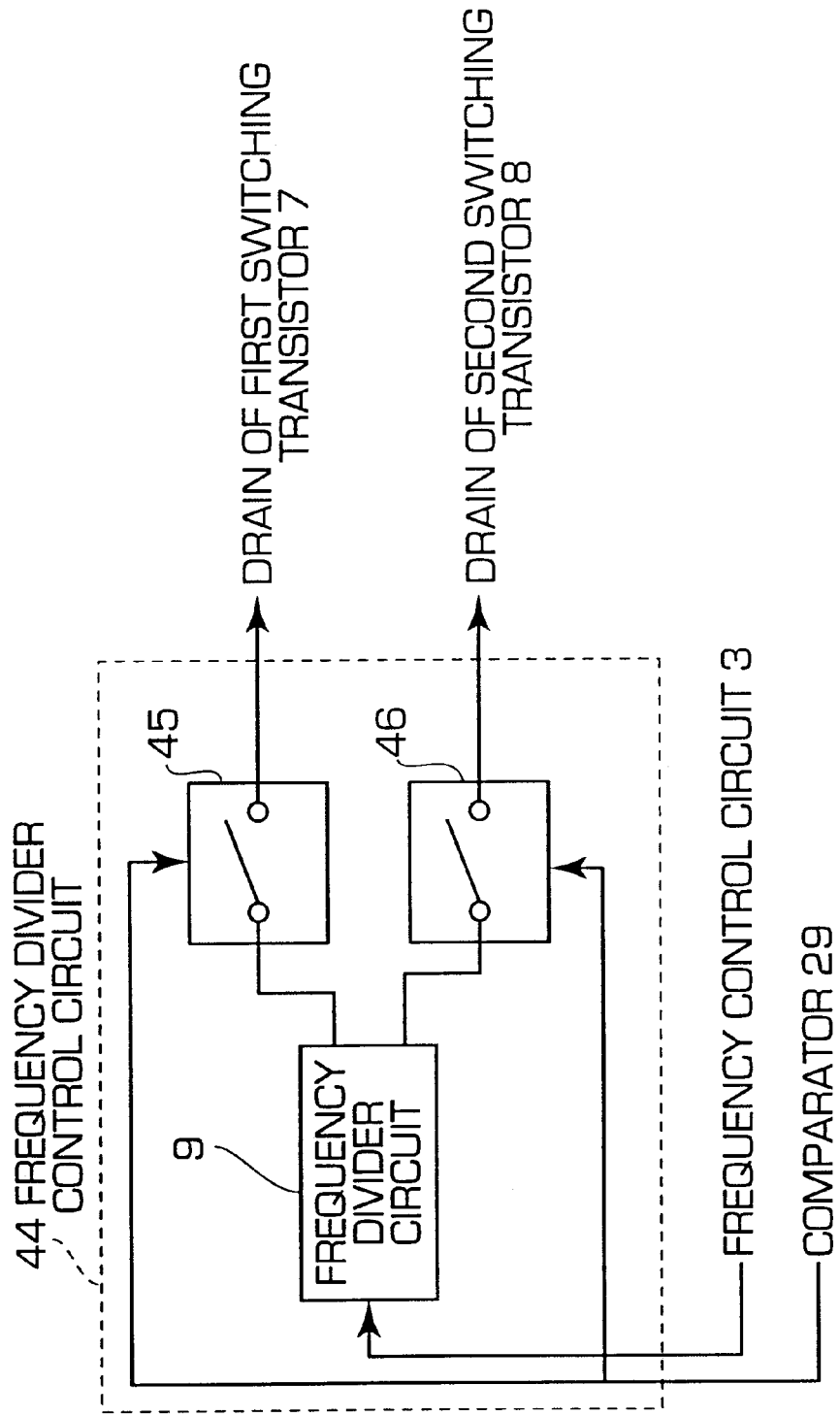
FIG. 25 is a block diagram showing the frequency divider control circuit of FIG. 5.

FIG. 5 is a block diagram showing the construction of the third embodiment of the present invention (the second type). This embodiment is identical to the first embodiment shown in FIG. 3 with the exception that frequency divider circuit 9 is replaced by frequency divider control circuit 44, the circuit in which duty is controlled by the output signal of comparator 29 of dimmer circuit $12_1$ is changed from drive voltage control circuit 11 to frequency divider control circuit 44 of booster circuit $4_3$, and drive voltage control circuit 11 is eliminated. Frequency divider control circuit 44 in this case is shown in FIG. 25. Here, the two outputs of frequency divider circuit 9 of the first embodiment are connected to switches 45 and 46. Switches 45 and 46 turn ON when a low-level signal is inputted and turn OFF when a high-level signal is inputted.

Figure 26:
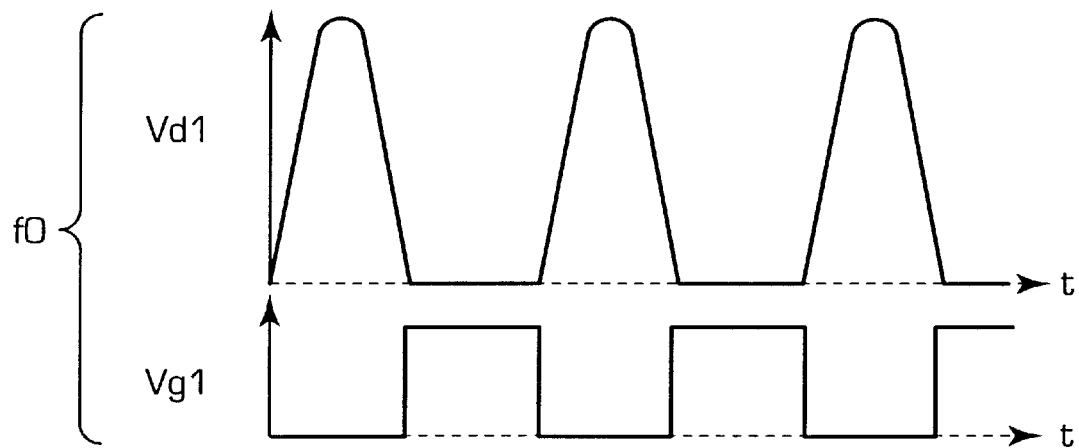
FIG. 26 is a voltage waveform chart of the first switching transistor drain and gate of FIG. 5.
Figure 26:
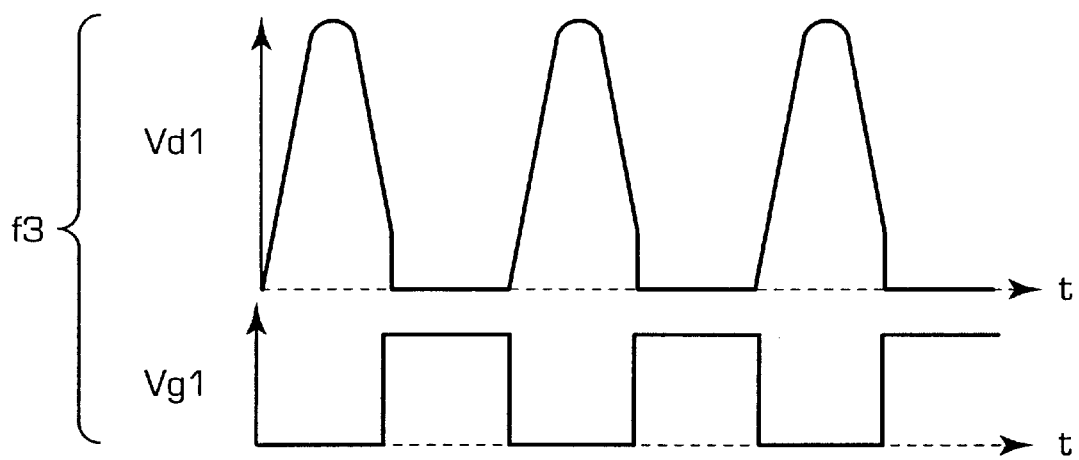
Figure 26:
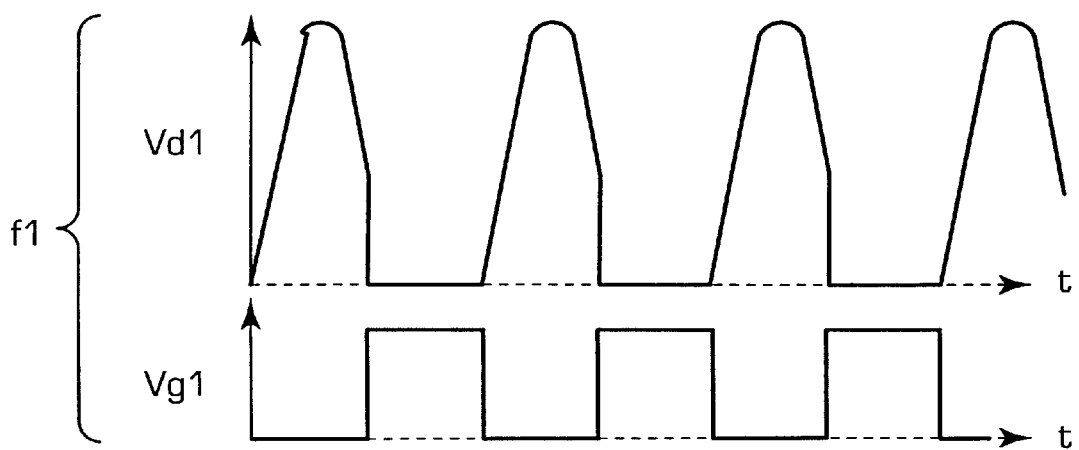

The circuit of FIG. 5 lacks a drive voltage control circuit, and the voltage inputted to piezoelectric transformer 1 therefore increases as the voltage of power source VDD increases, and piezoelectric transformer 1 is accordingly driven by a frequency of low boost ratio, i.e., of high drive frequency. At frequency f0 shown in FIG. 13, drain voltages Vd1 and Vd2 voltage-resonate in accordance with the equivalent input capacitance of piezoelectric transformer 1 and load 2 and the sum inductance of the primary side inductance and secondary side inductance of an electromagnetic transformer, and each are set to be the half-wave of a sine wave that reaches zero voltage in the time interval of one-half the resonance cycle of piezoelectric transformer 1. Accordingly, as shown in FIG. 26, the time of one cycle decreases as the drive frequency increases over resonance frequency f0, whereby the voltage immediately preceding zero switching rises and excessive current flows at the instant of zero switching. Here, Vd1 and Vd2 both have the same voltage waveform. As a result, the instant frequency divider control circuit 44 inverts, the peak value of the current flowing to first autotransformer 5, first switching transistor 7, second autotransformer 6, and second switching transistor 8 increases, heat is generated in these components, and electrical power is consumed in the form of heat, thereby reducing the conversion efficiency of the piezoelectric transformer drive circuit. Moreover, the conversion efficiency of the piezoelectric transformer itself drops as the drive frequency increases over the resonance frequency fr. As a result, when the power source VDD of the circuit shown in FIG. 5 is increased, the drive frequency of piezoelectric transformer rises, heat is generated, conversion efficiency drops, and the variable range of VDD cannot be broadened. When the piezoelectric transformer is driven at a frequency in the vicinity of the resonance frequency fr, however, electrical power is not consumed by the drive voltage control circuit, and a high-efficiency drive circuit can therefore be realized that also features a simplified circuit.

In addition, during the interval that output duty is OFF in the circuit shown in FIG. 5, a signal is also outputted from dimmer circuit $12_1$ to frequency divider circuit 44, switches 45 and 46 turn OFF, voltage is no longer impressed to the gates of first switching transistor 7 and second switching transistor 8, the drain-source of each switching transistor turns OFF, and the drive of piezoelectric transformer 1 halts.

Explanation will next be presented regarding the operation of the third embodiment of the present invention. In cases in which the cold cathode tube has high impedance and does not turn on due to such factors as low ambient temperature, or in a load-open state due to, for example, disconnection, the output of comparator 15 of frequency control circuit 3 becomes a signal that cuts off the discharge path of integrator 16 and the drive frequency drops continuously at a fixed rate. If output voltage comparison circuit $10_1$ detects overvoltage at frequency f3, it outputs Vp1 and Vp2. With the output of Vp1, integrator 16 is reset, the output voltage of integrator 16 becomes the minimum voltage, and the output of VCO 18 enters a state in which frequency divider circuit 9 outputs frequency f1. The drive frequency again drops from this frequency f1 at a fixed rate and the above-described operations are repeated. As shown in FIG. 12, the output Vb of dc voltage generation circuit 33 is decreased by the output of Vp2, the duty of the drive circuit decreases, and the amount of current per time unit flowing to first autotransformer 5, first switching transistor 7, second autotransformer 6, and second switching transistor 8 is reduced, thereby allowing a reduction of the generation of heat in these components.

Figure 6:
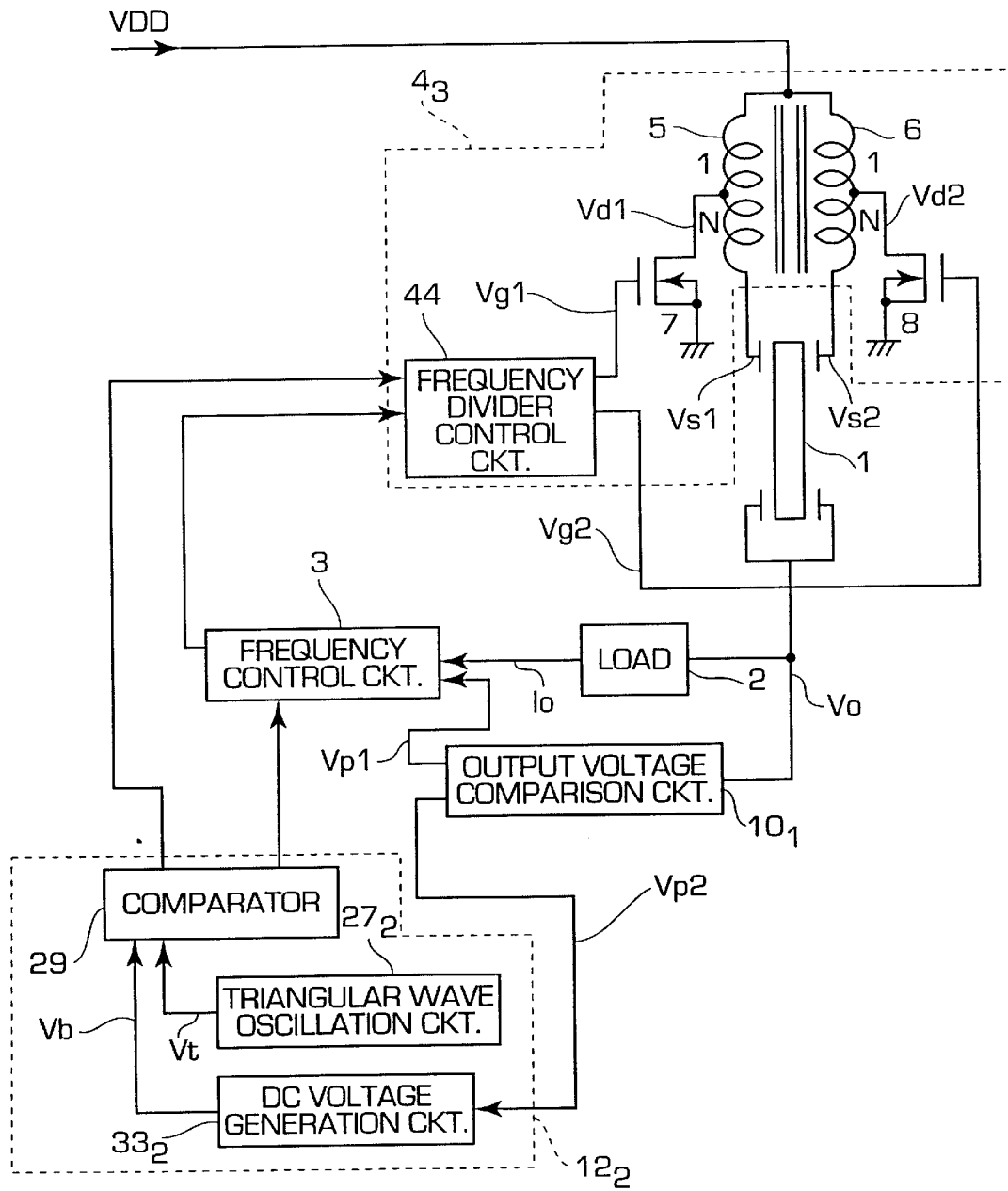
FIG. 6 is a block diagram showing a piezoelectric transformer drive circuit according to the fourth embodiment of the present invention.

FIG. 6 is a block diagram showing the construction of the fourth embodiment of the present invention. This embodiment is identical to the third embodiment shown in FIG. 5 with the exception of the elimination of Vp2 which controls dc voltage generation circuit $33_2$, and the addition of Vp2 which controls triangular wave oscillation circuit $27_2$ of dimmer circuit $12_2$. FIG. 22 is a block diagram showing dimmer circuit $12_2$ for this case, and FIG. 23 is a circuit diagram showing triangular wave oscillation circuit $27_2$ (the same as the second embodiment). As shown in FIG. 24, also in this embodiment, the drive circuit duty ratio can be varied by outputting a control signal Vp2 and increasing the minimum voltage of the triangular wave outputted from triangular wave oscillation circuit $27_2$ in cases in which output voltage comparison circuit $10_1$ detects overvoltage.

Figure 7:
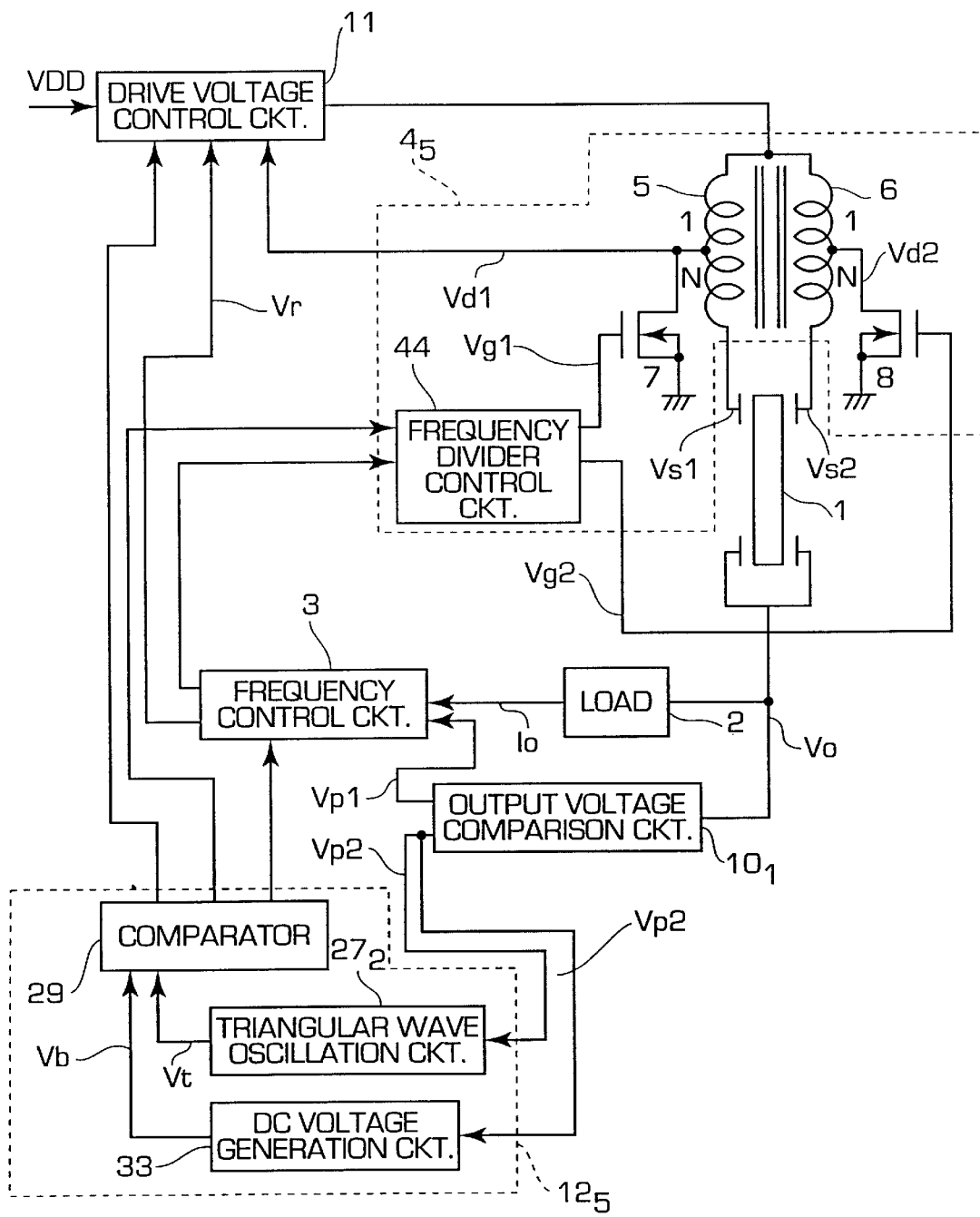
FIG. 7 is a block diagram showing a piezoelectric transformer drive circuit according to the fifth embodiment of the present invention.

FIG. 7 is a block diagram showing the construction of the fifth embodiment of the present invention. This embodiment is a combination of the embodiments of FIG. 3, FIG. 4, FIG. 5, and FIG. 6 and is characterized as a means of both reducing the output voltage Vb of dc voltage generation circuit 33 as well as increasing the minimum value of the output voltage of triangular wave oscillation circuit $27_2$, thereby decreasing the drive circuit duty ratio in cases in which output voltage comparison circuit $10_1$ detects overvoltage. This embodiment is also characterized by halting both drive voltage control circuit 11 and frequency divider control circuit 44 when the drive circuit is halted.

Figure 8:
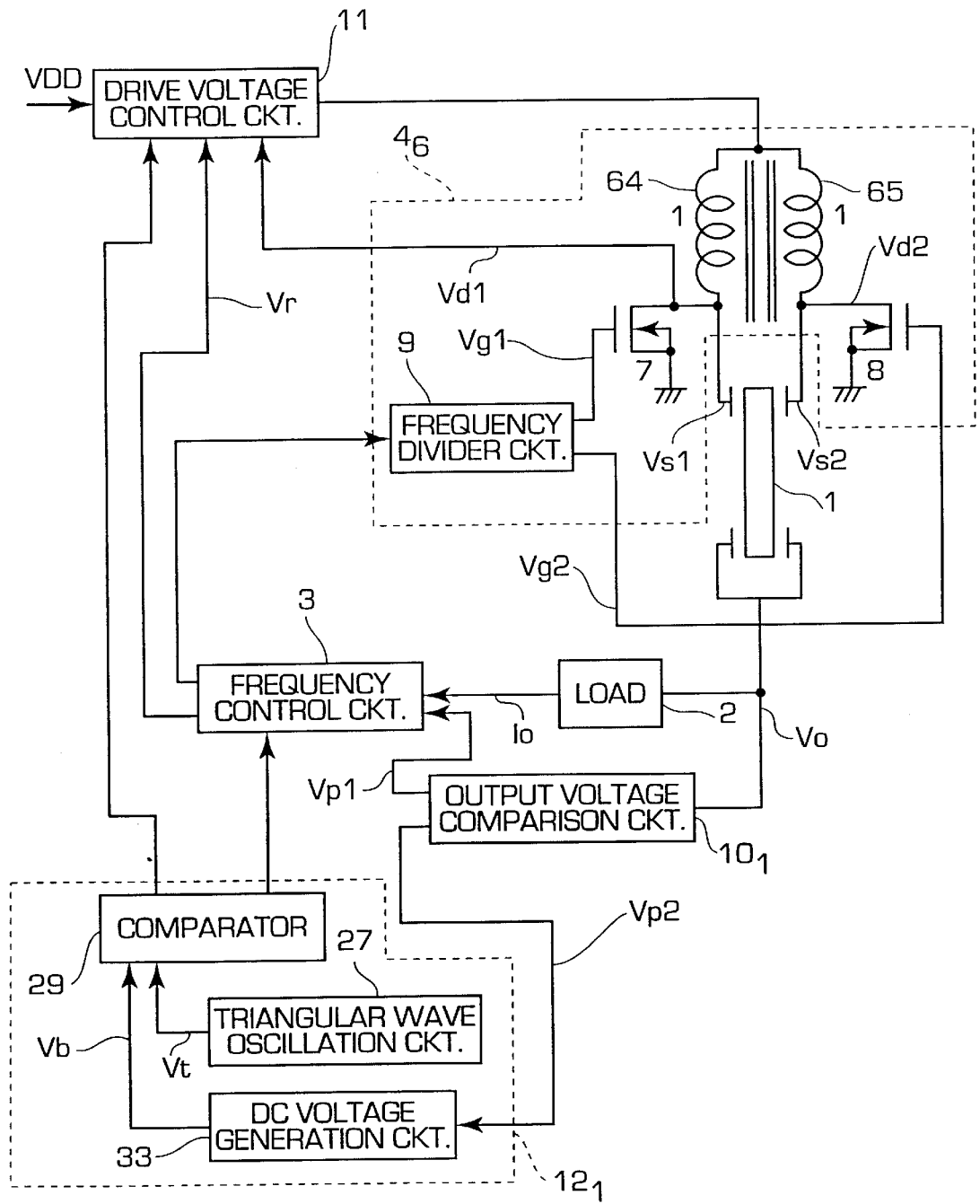
FIG. 8 is block diagram showing a piezoelectric transformer drive circuit according to the sixth embodiment of the present invention.

FIG. 8 is a block diagram showing the construction of the sixth embodiment of the present invention (the third type). This embodiment is identical to the embodiment shown in FIG. 3 with the exception of the replacement of the autotransformers by coils 64 and 65. The modification of the autotransformers to coils decreases the voltage that is inputted to piezoelectric transformer 1 by the same power source VDD. Although this modification prevents the driving of piezoelectric transformer 1 by a power source VDD of low voltage, this embodiment is an effective means of simplifying the circuit. The means for altering the duty ratio is identical to the circuit shown in FIG. 3.

Figure 9:
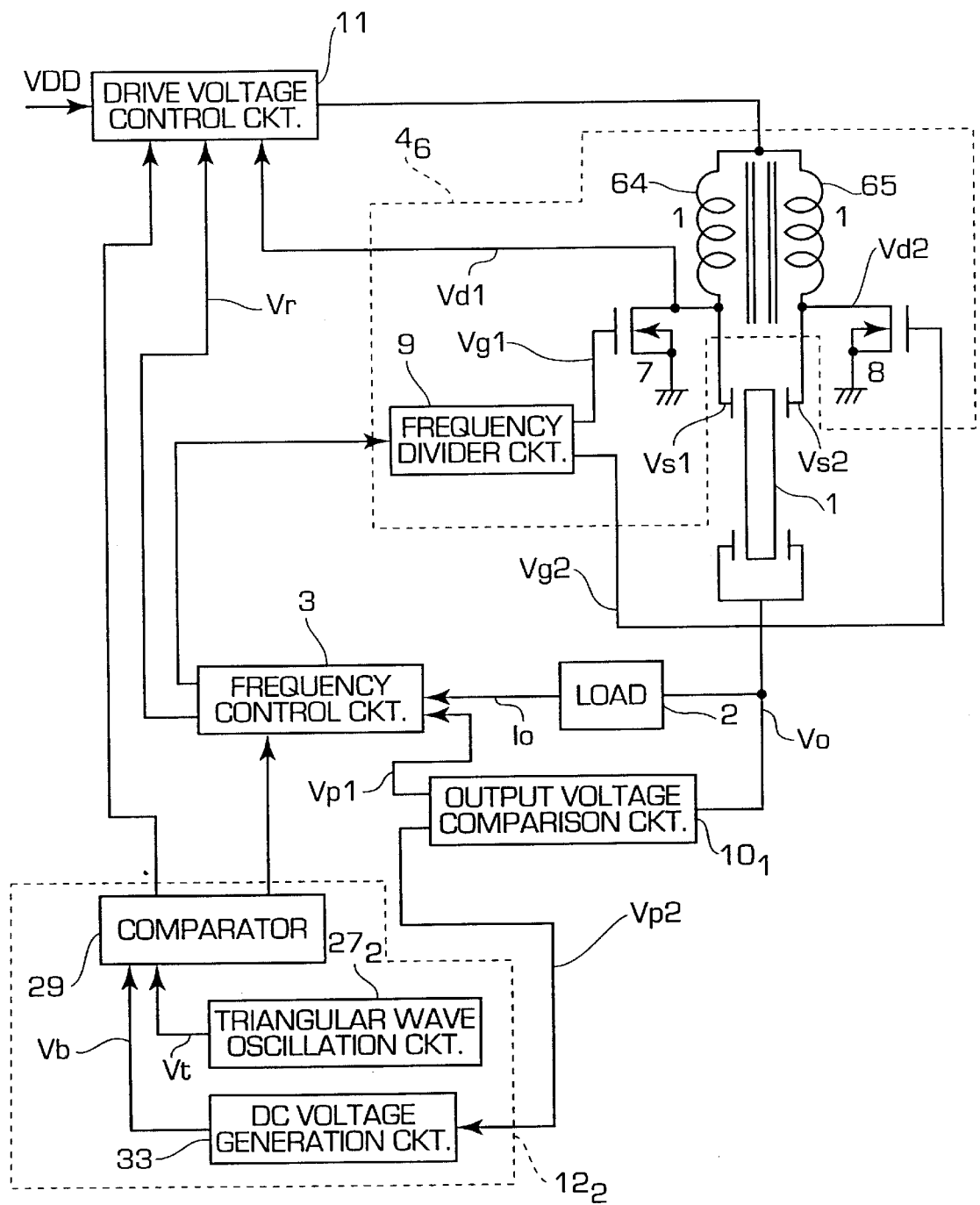
FIG. 9 is block diagram showing a piezoelectric transformer drive circuit according to the seventh embodiment of the present invention.

FIG. 9 is a block diagram showing the construction of the seventh embodiment of the present invention. This embodiment is identical to the embodiment shown in FIG. 4 with the exception of the replacement of the autotransformers by coils 64 and 65. The means for varying the duty ratio is also identical to the circuit of FIG. 4.

Figure 10:
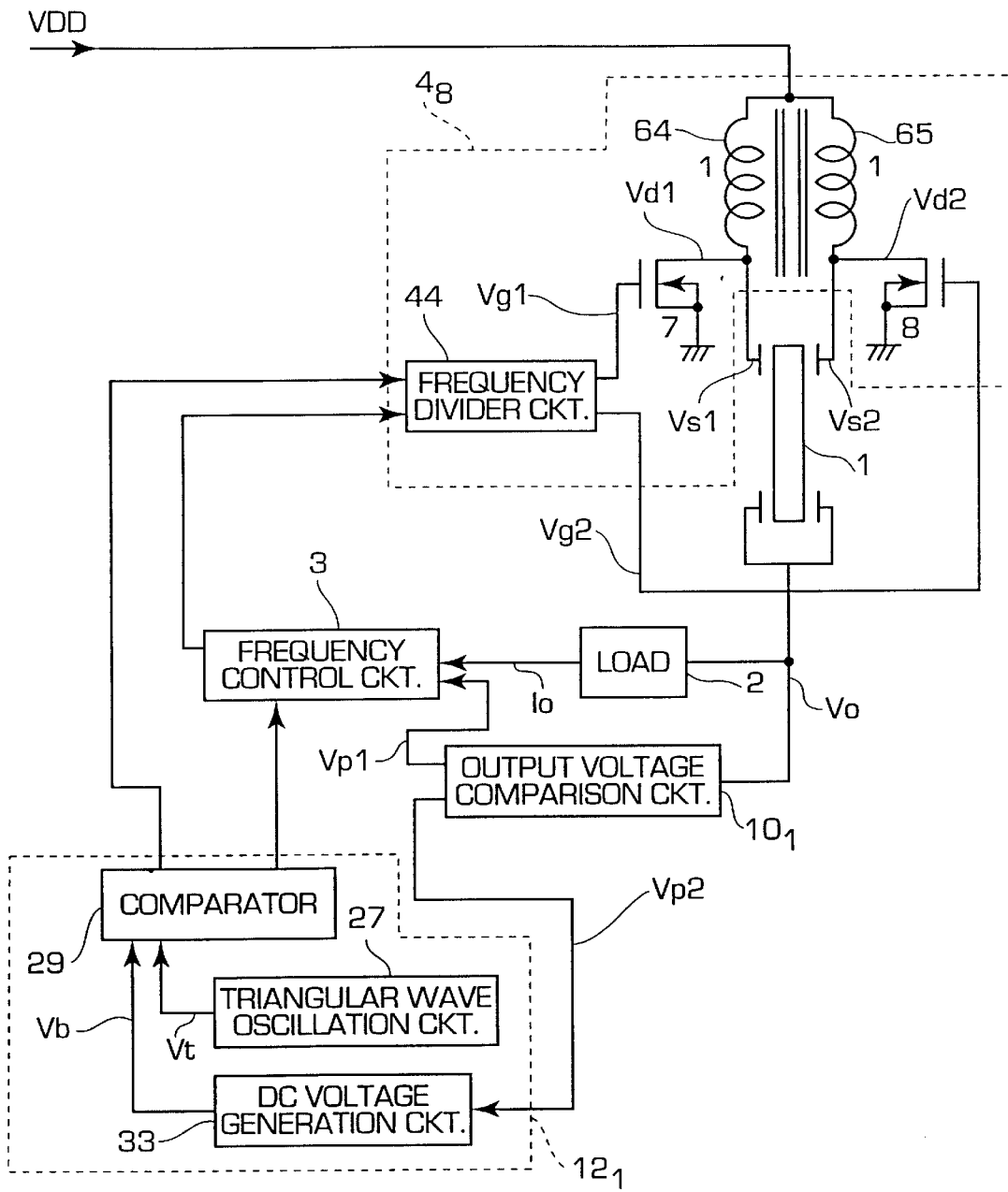
FIG. 10 is block diagram showing a piezoelectric transformer drive circuit according to the eighth embodiment of the present invention.

FIG. 10 is a block diagram showing the construction of the eighth embodiment of the present invention (the fourth type). This embodiment is the same as the circuit shown in FIG. 5 with the exception of the replacement of the autotransformers by coils 64 and 65. The means for varying duty ratio is also identical to the circuit of FIG. 5.

Figure 11:
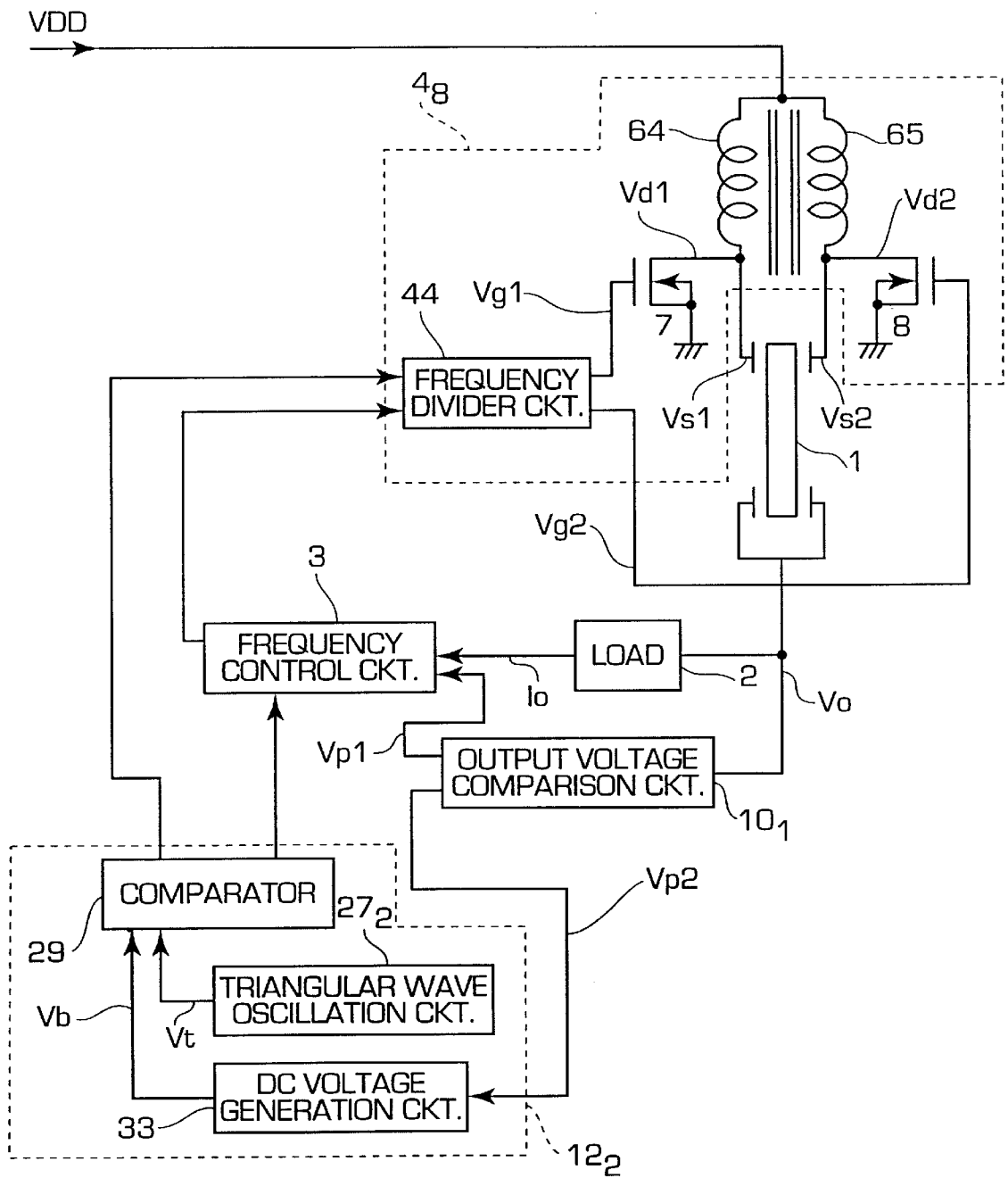
FIG. 11 is block diagram showing a piezoelectric transformer drive circuit according to the ninth embodiment of the present invention.

FIG. 11 is a block diagram showing the construction of the ninth embodiment of the present invention. This embodiment is the same as the embodiment of FIG. 6 with the exception of the replacement of the autotransformers by coils 64 and 65. The means for varying duty ratio is also identical to the circuit of FIG. 6.

In the above descriptions, use of output Vp2 from the output voltage comparison circuit for controlling both the dc voltage generation circuit and the triangular wave oscillation circuit to change the duty ratio were explained only about the fifth embodiment according to claim 5 as shown in FIG. 7. However, the same control can be applied also to all the other embodiments.

As described hereinabove, the piezoelectric transformer drive circuit of the present invention enables a reduction of heat generation in first autotransformer 5, first switching transistor 7, second autotransformer 6, and second switching transistor 8 in cases in which a cold cathode tube has high impedance and will not turn on due to such factors as low ambient temperature, or in a load-open state due to, for example, disconnection. In other words, the incorporation of an output voltage comparison circuit that outputs a duty ratio switching signal to a dimmer circuit in cases in which overvoltage is detected in the output allows switching between a duty ratio for driving a cold cathode tube as the load at normal temperatures and a duty ratio for cases in which the cold cathode tube has high impedance and does not start due to such factors as low ambient temperature or in a load-open state due to, for example, disconnection; and this switching of the duty ratio of the drive circuit to reduce the proportion of ON time thereby allows a reduction of the proportion of time during which an excessive current flows to the first autotransformer, first switching transistor, second autotransformer, and second switching transistor. Generation of heat in the first autotransformer, first switching transistor, second autotransformer, and second switching transistor can therefore be reduced in cases in which the cold cathode tube has high impedance and does not turn on due to, for example, low ambient temperature, or in cases of load-open states due to, for example, disconnection.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A piezoelectric transformer drive circuit comprising:
- a piezoelectric transformer which has an alternating current voltage as an input from primary electrodes, and which, using the piezoelectric effect, outputs an output to a load from secondary electrodes;
- a drive voltage control circuit that is connected to a power source and that controls a peak voltage that drives the piezoelectric transformer at a fixed level;
- a first autotransformer having a first secondary terminal connected to one of the primary electrodes of the piezoelectric transformer and having a first primary terminal connected to the drive voltage control circuit;
- a first switching transistor having a first output terminal connected to a first intermediate terminal of the first autotransformer and to the drive voltage control circuit;
- a second autotransformer having a second secondary terminal connected to the other of the primary electrodes of the piezoelectric transformer and having a second primary terminal connected to the drive voltage control circuit;
- a second switching transistor having a second output terminal connected to a second intermediate terminal of the second autotransformer;
- a frequency divider circuit that alternately drives the first switching transistor and the second switching transistor;
- a frequency control circuit that outputs a triangular wave signal both to the frequency divider circuit and to the drive voltage control circuit;
- a dimmer circuit that comprises: a dc voltage generation circuit, a triangular wave oscillation circuit and a comparator which compares both output values from said dc voltage generation and said triangular wave oscillation circuits, wherein said dimmer circuit generates a drive halt signal to the drive voltage control circuit, performs control of a duty ratio for driving said piezoelectric transformer, and outputs a first control signal to the frequency control circuit such that the frequency of a VCO of the frequency control circuit does not change during drive halts; and
- an output voltage comparison circuit that both outputs a reset signal to the frequency control circuit and outputs a second control signal to the dimmer circuit to change the duty ratio upon detecting overvoltage in the piezoelectric transformer output.

2. A piezoelectric transformer drive circuit according to claim 1 wherein the second control signal outputted from said output voltage comparison circuit alters the duty ratio by changing a dc voltage value outputted from the dc voltage generation circuit to the comparator in the dimmer circuit.

3. A piezoelectric transformer drive circuit according to claim 1 wherein the second control signal outputted from said output voltage comparison circuit alters the duty ratio by changing a triangular wave minimum voltage value outputted from the triangular oscillation circuit to the comparator in the dimmer circuit.

4. A piezoelectric transformer drive circuit according to claim 1 wherein the second control signal outputted from said output voltage comparison circuit alters the duty ratio by changing both dc voltage value and the triangular wave minimum voltage value outputted from the dc generation circuit and the triangular wave oscillation circuit, respectively, to the comparator in the dimmer circuit.

5. A piezoelectric transformer drive circuit comprising:
- a piezoelectric transformer which has an alternating current voltage as an input from primary electrodes, and which, using the piezoelectric effect, outputs an output to a load from secondary electrodes;
- a first autotransformer having a first secondary terminal connected to one of the primary electrodes of the piezoelectric transformer and having a first primary terminal connected to a power source;
- a first switching transistor having a first output terminal connected to a first intermediate terminal of the first autotransformer;
- a second autotransformer having a second secondary terminal connected to the other of the primary electrodes of the piezoelectric transformer and having a second primary terminal connected to the power source;
- a second switching transistor having a second output terminal connected to a second intermediate terminal of the second autotransformer;
- a frequency divider control circuit that alternately drives the first switching transistor and the second switching transistor;
- a frequency control circuit that outputs a triangular wave signal to the frequency divider control circuit;
- a dimmer circuit that comprises: a dc voltage generation circuit, a triangular wave oscillation circuit and a comparator which compares both output values from the dc voltage generation and the triangular wave oscillation circuits, wherein said dimmer circuit generates a drive halt signal to the frequency divider control circuit, performs control of a duty ratio for driving said piezoelectric transformer, and outputs a first control signal to the frequency control circuit such that the output frequency of a VCO of the frequency control circuit does not change during drive halts; and
- an output voltage comparison circuit that both outputs a reset signal to the frequency control circuit and outputs a second control signal to the dimmer circuit to change the duty ratio upon detecting overvoltage in the piezoelectric transformer output.

6. A piezoelectric transformer drive circuit according to claim 5 wherein the second control signal outputted from said output voltage comparison circuit alters the duty ratio by changing a dc voltage value outputted from the dc voltage generation circuit to the comparator in the dimmer circuit.

7. A piezoelectric transformer drive circuit according to claim 5 wherein the second control signal outputted from said output voltage comparison circuit alters the duty ratio by changing a triangular wave minimum voltage value outputted from the triangular oscillation circuit to the comparator in the dimmer circuit.

8. A piezoelectric transformer drive circuit according to claim 5 wherein the second control signal outputted from said output voltage comparison circuit alters the duty ratio by changing both dc voltage value and the triangular wave minimum voltage value outputted from the dc generation circuit and the triangular wave oscillation circuit, respectively, to the comparator in the dimmer circuit.

9. A piezoelectric transformer drive circuit comprising:
- a piezoelectric transformer which has an alternating current voltage as an input from primary electrodes, and which, using the piezoelectric effect, outputs an output to a load from secondary electrodes;
- a drive voltage control circuit that is connected to a power source and that controls a peak voltage that drives the piezoelectric transformer at a fixed level;
- a first coil connected between one of the primary electrodes of the piezoelectric transformer and the drive voltage control circuit;

a first switching transistor having its output terminal connected to one of the primary electrodes of the piezoelectric transformer and to the drive voltage control circuit;

a second coil connected between the other of the primary electrodes of the piezoelectric transformer and the drive voltage control circuit;

a second switching transistor having its output terminal connected to the other of the primary electrodes of the piezoelectric transformer;

a frequency divider circuit that alternately drives the first switching transistor and the second switching transistor;

a frequency control circuit that outputs a triangular wave signal both to the frequency divider circuit and to the drive voltage control circuit;

a dimmer circuit that comprises: a dc voltage generation circuit, a triangular wave oscillation circuit and a comparator which compares both output values from the dc voltage generation and the triangular wave oscillation circuits, wherein said dimmer circuit generates a drive halt signal to the drive voltage control circuit, performs control of a duty ratio for driving said piezoelectric transformer, and outputs a first control signal to the frequency control circuit such that the frequency of a VCO of the frequency control circuit does not change during drive halts; and an output voltage comparison circuit that both outputs a reset signal to the frequency control circuit and outputs a second control signal to the dimmer circuit to change the duty ratio upon detecting overvoltage in the piezoelectric transformer output.

10. A piezoelectric transformer drive circuit according to claim 9 wherein the second control signal outputted from said output voltage comparison circuit alters the duty ratio by changing a dc voltage value outputted from the dc voltage generation circuit to the comparator in the dimmer circuit.

11. A piezoelectric transformer drive circuit according to claim 9 wherein the second control signal outputted from said output voltage comparison circuit alters the duty ratio by changing a triangular wave minimum voltage value outputted from the triangular oscillation circuit to the comparator in the dimmer circuit.

12. A piezoelectric transformer drive circuit according to claim 9 wherein the second control signal outputted from said output voltage comparison circuit alters the duty ratio by changing both dc voltage value and the triangular wave minimum voltage value outputted from the dc generation circuit and the triangular wave oscillation circuit, respectively, to the comparator in the dimmer circuit.

13. A piezoelectric transformer drive circuit comprising:

a piezoelectric transformer which has an alternating current voltage as an input from primary electrodes, and which, using the piezoelectric effect, outputs an output to a load from secondary electrodes;

a first coil connected between one of the primary electrodes of the piezoelectric transformer and a power source;

a first switching transistor having a first output terminal connected to one of the primary electrodes of the piezoelectric transformer;

a second coil connected between the other of the primary electrodes of the piezoelectric transformer an the power source;

a second switching transistor having a second output terminal connected to the other of the primary electrodes of the piezoelectric transformer;

a frequency divider control circuit that alternately drives the first switching transistor and the second switching transistor;

a frequency control circuit that outputs a triangular wave signal to the frequency divider control circuit;

a dimmer circuit that comprises: a dc voltage generation circuit, a triangular wave oscillation circuit and a comparator which compares both output values from the dc voltage generation and the triangular wave oscillation circuits, wherein said dimmer circuit generates a drive halt signal to the frequency divider control circuit, performs control of a duty ratio for driving said piezoelectric transformer, and outputs a first control signal to the frequency control circuit such that the output frequency of a VCO of the frequency control circuit does not change during drive halts; and an output voltage comparison circuit that both outputs a reset signal to the frequency control circuit and outputs a second control signal to the dimmer circuit to change the duty ratio upon detecting overvoltage in the piezoelectric transformer output.

14. A piezoelectric transformer drive circuit according to claim 13 wherein the second control signal outputted from said output voltage comparison circuit alters the duty ratio by changing a dc voltage value outputted from the dc voltage generation circuit to the comparator in the dimmer circuit.

15. A piezoelectric transformer drive circuit according to claim 13 wherein the second control signal outputted from said output voltage comparison circuit alters the duty ratio by changing a triangular wave minimum voltage value outputted from the triangular oscillation circuit to the comparator in the dimmer circuit.

16. A piezoelectric transformer drive circuit according to claim 13 wherein the second control signal outputted from said output voltage comparison circuit alters the duty ratio by changing both dc voltage value and the triangular wave minimum voltage value outputted from the dc generation circuit and the triangular wave oscillation circuit, respectively, to the comparator in the dimmer circuit.

* * * * *